(12) United States Patent
Ai

(10) Patent No.: US 12,342,526 B2
(45) Date of Patent: Jun. 24, 2025

(54) SEMICONDUCTOR DEVICE AND METHOD FOR FABRICATING THE SAME

(71) Applicant: NANYA TECHNOLOGY CORPORATION, New Taipei (TW)

(72) Inventor: Tsu-Chieh Ai, Taitung (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 0 days.

(21) Appl. No.: 18/381,916

(22) Filed: Oct. 19, 2023

(65) Prior Publication Data

US 2024/0049448 A1    Feb. 8, 2024

Related U.S. Application Data

(63) Continuation of application No. 17/486,402, filed on Sep. 27, 2021, now Pat. No. 11,877,436.

(51) Int. Cl.
H10B 12/00     (2023.01)
H01L 23/00     (2006.01)
H10D 64/23     (2025.01)

(52) U.S. Cl.
CPC .......... *H10B 12/31* (2023.02); *H01L 23/564* (2013.01); *H10B 12/033* (2023.02); *H10D 64/251* (2025.01)

(58) Field of Classification Search
CPC ..... H10B 12/31; H10B 12/033; H01L 23/564; H01L 29/41725; H01L 28/90
See application file for complete search history.

(56) References Cited

U.S. PATENT DOCUMENTS

2010/0052098 A1*  3/2010  Miyajima ............... H01L 28/60
                                                 257/532
2010/0270647 A1* 10/2010  Cho .................. H01L 21/32136
                                                 257/532
2013/0056850 A1*  3/2013  Kume ................... H10B 12/315
                                                 257/532

* cited by examiner

Primary Examiner — Mohammed R Alam
(74) Attorney, Agent, or Firm — Xuan Zhang

(57) ABSTRACT

A semiconductor device and a method of manufacturing a semiconductor device are provided. The semiconductor device includes a substrate and a conductive pad disposed on the substrate and having a first surface facing away from the substrate. The first surface of the conductive pad is recessed toward the substrate and defines a recessed portion. The semiconductor device also includes a capacitor structure at least partially disposed within the recessed portion of the conductive pad and electrically connected with the substrate through the conductive pad.

4 Claims, 22 Drawing Sheets

SEMICONDUCTOR DEVICE AND METHOD FOR FABRICATING THE SAME

CROSS-REFERENCE TO RELATED APPLICATION

This application is a continuation application of U.S. Non-Provisional application Ser. No. 17/486,402 filed Sep. 27, 2021, which is incorporated herein by reference in its entirety.

TECHNICAL FIELD

The present disclosure relates to a semiconductor device and a method for fabricating the semiconductor device, and more particularly, to a semiconductor device having a capacitor and a method for fabricating the semiconductor device having the capacitor.

DISCUSSION OF THE BACKGROUND

A supporting structure (such as a supporting beam or a lattice film) may be used in a semiconductor device to support a side of a capacitor and prevent short circuit or wobbling of the capacitor. Dimensions of semiconductor devices are continuously being scaled down to meet the increasing demand of computing ability, and a variety of issues arise during the scaling-down process. For example, the supporting structure may be disadvantageously more difficult to be penetrated or punched through, which may impact the final electrical characteristics, quality, and yield.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a semiconductor device. The semiconductor device includes a substrate and a conductive pad disposed on the substrate and having a first surface facing away from the substrate. The first surface of the conductive pad is recessed toward the substrate and defines a recessed portion. The semiconductor device also includes a capacitor structure at least partially disposed within the recessed portion of the conductive pad and electrically connected with the substrate through the conductive pad.

Another aspect of the present disclosure provides a semiconductor device. The semiconductor device includes a substrate and a conductive pad disposed on the substrate. The semiconductor device also includes a capacitor structure disposed on the conductive pad and electrically connected with the substrate through the conductive pad. The capacitor structure at least partially extends into the conductive pad.

Another aspect of the present disclosure provides a method of manufacturing a semiconductor device. The method includes disposing a dielectric layer on a conductive pad and forming an opening through the dielectric layer. A lateral surface and a bottom surface of a recessed portion of the conductive pad are exposed through the opening of the dielectric layer. The method also includes disposing an electrode material on the lateral surface and the bottom surface of the recessed portion of the conductive pad.

The recessed portion defined by the conductive pad may support or fix the capacitor structure. Therefore, no (or less) supporting structure is needed. The under-etching issues may be solved or alleviated. In addition, the contact area between the capacitor structure and the conductive pad may be increased and the electrical stability of the semiconductor device may be enhanced.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1:
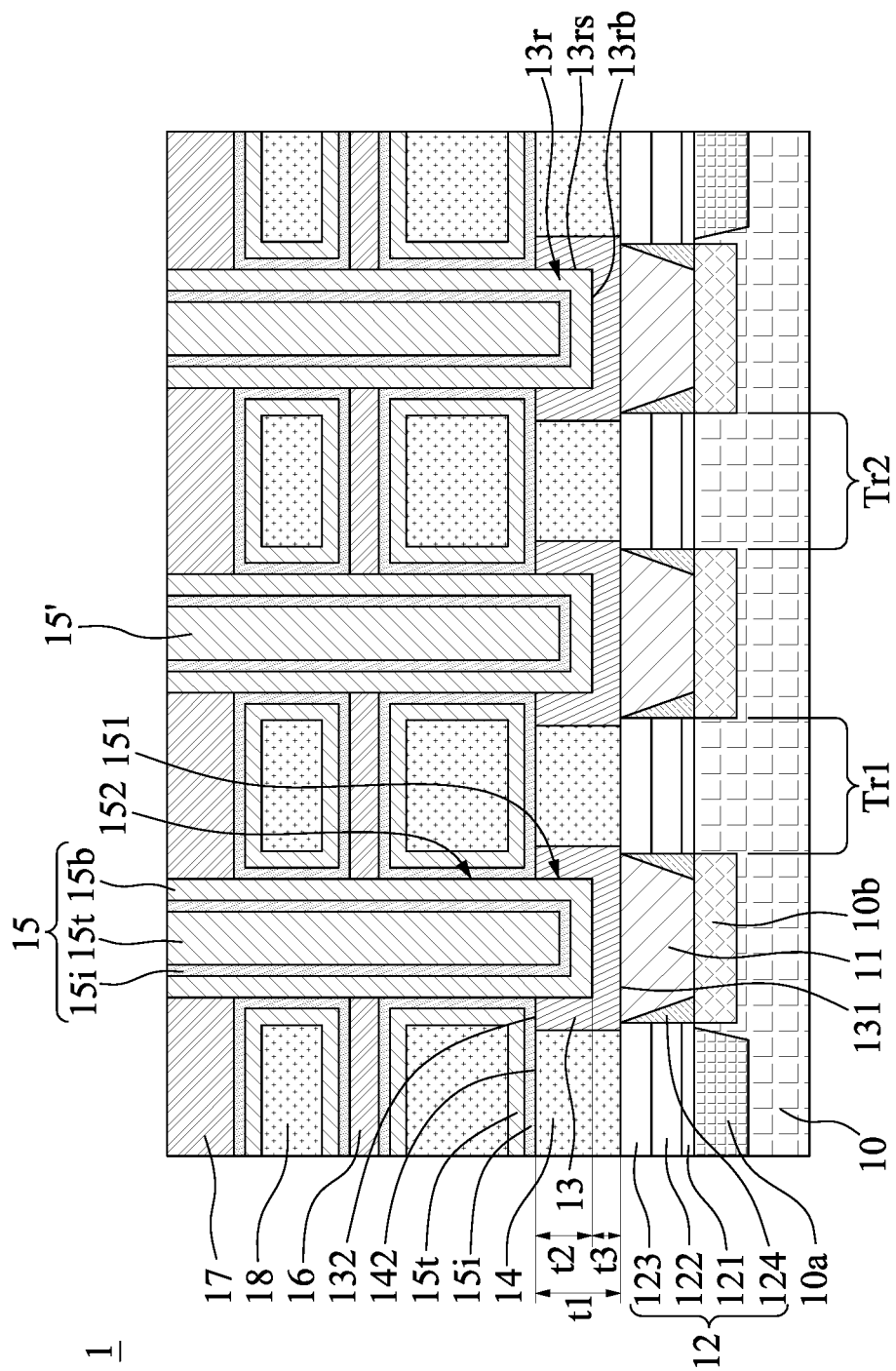
FIG. 1 illustrates a cross-sectional view of a semiconductor device in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 illustrates a cross-sectional view of a semiconductor device 1 in accordance with some embodiments of the present disclosure. In some embodiments, the semiconductor device 1 may include a circuit, such as a memory cell. In some embodiments, the memory cell may include a dynamic random access memory cell (DRAM cell). As shown in FIG. 1, in some embodiments, the semiconductor device 1 may include a substrate 10, a capacitor plug 11, a gate stack 12, a conductive pad 13, a dielectric layer 14, a capacitor structure 15, supporting structures 16 and 17, and an insulating layer 18.

In some embodiments, the substrate 10 may include, for example, silicon (Si), germanium (Ge), silicon germanium (SiGe), silicon carbide (SiC), silicon germanium carbide (SiGeC), gallium (Ga), gallium arsenide (GaAs), indium (In), indium arsenide (InAs), indium phosphide (InP) or other Iv-Iv, III-V or II-VI semiconductor materials. In some other embodiments, the substrate 10 may include a layered semiconductor such as silicon/silicon germanium, silicon-on-insulator, or silicon germanium-on-insulator.

In some embodiments, one or more isolation structures 10a may be formed in the substrate 10. The isolation structure 10a may include a shallow trench isolation (STI) structure. In some embodiments, the isolation structure 10a may include an insulating material such as silicon oxide (SiO2), silicon nitride (Si3N4), silicon oxynitride (N2OSi2), silicon nitride oxide (N2OSi2), or fluorine-doped silica. In some embodiments, the isolation structure 10a may define one or more active areas of the substrate 10.

In some embodiments, one or more doped regions 10b may be formed in an upper portion of the active area of the substrate 10 between two of the isolation structures 10a. In some embodiments, the doped region 10b may be doped with an N-type dopant such as phosphorus (P), arsenic (As), or antimony (Sb) for forming an NMOSFET (N-channel metal oxide semiconductor field effect transistor). In some other embodiments, the doped region 10b may be doped with a P-type dopant such as boron (B) or indium (In) for forming a PMOSFET.

In some embodiments, transistors (e.g., switching transistors) Tr1 and Tr2 may be formed in an active area of the substrate 10 between two of the isolation structures 10a. The doped region 10b may include a source junction or a drain junction of the transistor Tr1 and the transistor Tr2. In some embodiments, the transistor Tr1 and the transistor Tr2 may share a source junction or a drain junction.

In some embodiments, the transistor Tr1 and the transistor Tr2 may each include a gate stack 12. In some embodiments, the gate stack 12 may include a gate dielectric 121, a gate structure 122, a gate mask 123, and a spacer structure 124. In some embodiments, the gate dielectric 121 may include a silicon oxide layer, the gate structure 122 may include a polycrystalline silicon layer, and the gate mask 123 may include a tungsten silicide layer. In some embodiments, the spacer structure 124 may include a silicon nitride layer. The structures and the materials of the layers in the transistor Tr1 and the transistor Tr2 may be adjusted based on design requirements and are not limited to the specific details stated above.

One or more capacitor plugs 11 may be disposed on the substrate 10. For example, the capacitor plug 11 may be in contact with the doped region 10b of the substrate 10. For example, the capacitor plug 11 may be electrically connected to the doped region 10b of the substrate 10. In some embodiments, the capacitor plug 11 may be electrically connected with the capacitor structure 15 through the conductive pad 13. In some embodiments, the capacitor plug 11 may include doped polysilicon (poly-Si), titanium (Ti), titanium nitride (TiN), tantalum (Ta), tantalum nitride (TaN), tungsten (W), copper (Cu), aluminum (Al) or an alloy thereof.

In some embodiments, one or more bit lines and one or more word lines (not shown in the figures) may be formed between two adjacent transistors (such as the transistor Tr1 and the transistor Tr2). Furthermore, the bit lines and word lines may each be electrically connected to a plug (such as a bit-line plug, not shown in the figures), which may be at the same layer or surface as the capacitor plug 11.

In some embodiments, the gate stack 12, the capacitor plug 11, and the bit-line plug (if any) may be formed in a dielectric layer (not shown in the figures) or a plurality of dielectric layers stacked on one another. For example, the capacitor plug 11 may penetrate through the stacked dielectric layers to contact the doped region 10b of the substrate 10.

The conductive pad 13 may be disposed on the capacitor plug 11. For example, the conductive pad 13 may be in contact with the capacitor plug 11. For example, the conductive pad 13 may be electrically connected to the capacitor plug 11. In some embodiments, similar to the capacitor plug 11, the conductive pad 13 may include doped polysilicon (poly-Si), titanium (Ti), titanium nitride (TiN), tantalum (Ta), tantalum nitride (TaN), tungsten (W), copper (Cu), aluminum (Al) or an alloy thereof.

As shown in FIG. 1, the dielectric layer 14 may surround the conductive pad 13. In some embodiments, the conductive pad 13 may be partially exposed from the dielectric layer 14. For example, the conductive pad 13 may penetrate through the dielectric layer 14. The conductive pad 13 may have a surface 131 and a surface 132 opposite to the surface 131. The surface 131 may face and be in contact with the conductive plug 11. The surface 132 may face way from the conductive plug 11 and the substrate 10.

In some embodiments, the dielectric layer 14 may include silicon oxide ($SiO_2$), carbon-doped silicon oxide, silicon nitride ($Si_3N_4$), silicon oxynitride ($N_2OSi_2$), silicon nitride oxide ($N_2OSi_2$), flowable oxide (FOx), undoped silicate glass (USG), borosilicate glass (BSG), phosphosilicate glass (PSG), borophosphosilicate glass (BPSG), tetraethyl orthosilicate (TEOS), fluorosilicate glass (FSG), xerogel, aerogel, amorphous fluorinated carbon (a-CFx), parylene, benzocyclobutene (BCB), polyimide (PI), or a combination thereof.

In some embodiments, the surface 132 of the conductive pad 13 may be substantially coplanar with a surface 142 of the dielectric layer 14. In some embodiments, the surface 132 of the conductive pad 13 may be recessed toward the surface 131. In other words, the surface 132 may be recessed into the conductive pad 13.

For example, the conductive pad 13 may define a cavity or a recessed portion 13r. Specifically, the recessed portion 13r may have a bottom surface 13rb and a lateral surface 13rs. The bottom surface 13rb may be recessed from the surface 132 and the lateral surface 13rs may extend between the bottom surface 13rb and the surface 132.

For example, the conductive pad 13 may have a dimension (such as a thickness t1 or the shortest distance) measured between the surface 131 and the surface 132 and a dimension (such as a thickness t3 or the shortest distance) measured between the surface 131 and the bottom surface 13rb. The thickness t1 may be greater than the thickness t3. In other words, the conductive pad 13 may have at least two different thicknesses t1 and t3.

In some embodiments, the lateral surface 13rs may be non-perpendicular to or inclined with respect to the surface 132. In some embodiments, the lateral surface 13rs may be curved. In some embodiments, the corner between the lateral surface 13rs and the bottom surface 13rb may be curved or may include a fillet edge. In some embodiments, the recessed portion 13r defined by the conductive pad 13 may include, but is not limited to, a bowl-shaped profile, a U-shaped profile, or another feasible profile.

In some embodiments, the recessed portion 13r defined by the conductive pad 13 may be configured to receive or accommodate the capacitor structure 15. For example, the capacitor structure 15 may be at least partially surrounded or covered by the conductive pad 13. For example, the capacitor structure 15 may at least partially penetrate the conductive pad 13. For example, the capacitor structure 15 may at least partially extend into the conductive pad 13. For example, the capacitor structure 15 may at least partially penetrate the conductive pad 13 from the surface 132 to the surface 131. For example, the capacitor structure 15 may extend into the conductive pad 13 and an end of the capacitor structure 15 may locate between the surface 132 and the surface 131. For example, the capacitor structure 15 may be in contact with the lateral surface 13rs and the bottom surface 13rb of the recessed portion 13r. For example, the capacitor structure 15 may be partially disposed, received, or accommodated in the recessed portion 13r and partially extend from the conductive pad 13. For example, the bottom of the capacitor structure 15 (or an end or a surface thereof) may be disposed at an elevation between the surface 131 and the surface 132 of the conductive pad 13. For example, an interface between the capacitor structure 15 and the conductive pad 13 may be spaced apart from the surface 132 of the conductive pad 13. For example, an interface between the capacitor structure 15 and the conductive pad 13 may be angled with (or non-coplanar with) the surface 132 of the conductive pad 13.

The depth of the recessed portion 13r may be a distance t2 (such as the shortest distance) between the surface 132 and the bottom surface 13rb. In some embodiments, the depth (i.e., the distance t2) of the recessed portion 13r may exceed over a half of the thickness t1 measured between the surface 131 and the surface 132 of the conductive pad 13. In other words, the thickness t3 measured between the surface 131 and the bottom surface 13rb may be less than a half of the thickness t1.

In some embodiments, the capacitor structure 15 may include a bottom electrode 15b, an insulating layer 15i, and a top electrode 15t. In some embodiments, the bottom electrode 15b, the insulating layer 15i, and/or the top electrode 15t of the capacitor structure 15 may be at least partially disposed, received, or accommodated in the recessed portion 13r of the conductive pad 13. In some embodiments, the bottom electrode 15b, the insulating layer 15i, and/or the top electrode 15t of the capacitor structure 15 may at least partially penetrate the conductive pad 13. In some embodiments, the bottom electrode 15b, the insulating layer 15i, and/or the top electrode 15t of the capacitor structure 15 may at least partially extend into the conductive pad 13. For example, an end or a surface of the bottom electrode 15b, the insulating layer 15i, and/or the top electrode 15t may be disposed at an elevation between the surface 131 and the surface 132 of the conductive pad 13.

For example, a part of the top electrode 15t may be surrounded by the insulating layer 15i, surrounded by the bottom electrode 15b, and further surrounded by the lateral surface 13rs of the recessed portion 13r. For example, a part of the insulating layer 15*i* may be surrounded by the bottom electrode 15*b* and the lateral surface 13*rs* of the recessed portion 13*r*. For example, a part of the bottom electrode 15*b* may be surrounded by and in contact with the lateral surface 13*rs* of the recessed portion 13*r*.

In some embodiments, the capacitor structure 15 may be electrically connected to the conductive pad 13 and the capacitor plug 11. In some embodiments, the bottom electrode 15*b* may be coupled via the conductive pad 13 and the capacitor plug 11 to a source junction or a drain junction of a corresponding transistor. Thus, each of such bottom electrodes 15*b* may be applied as a storage node of a storage capacitor for a DRAM cell. Furthermore, in some embodiments, the top electrode 15*t* may be a common electrode that may be coupled to a ground node within the DRAM cell. In some embodiments, the top electrode 15*t* may be connected through other parts of the electrode material of the top electrode 15*t* or through another conductive element. In some embodiments, the capacitor structure 15 may include a cylinder-type capacitor. The term "cylinder-type" implies, for example, a capacitor having a hollow cylinder-like shape, the bottom surface thereof being a square, a circle, etc.

The insulating layer 15*i* may be disposed on the bottom electrode 15*b*. For example, the insulating layer 15*i* may be disposed on the inside of the bottom electrode 15*b*. In some embodiments, the insulating layer 15*i* may be disposed between the bottom electrode 15*b* and the top electrode 15*t*. In some embodiments, the insulating layer 15*i* may be connected through other parts of the insulating material of the insulating layer 15*i*.

In some embodiments, the insulating layer 15*i*' may be disposed on a coplanar surface defined by the surface 142 of the dielectric layer 14 and the surface 132 of the conductive pad 13. For example, the insulating layer 15*i*' may be disposed on the outside of the bottom electrode 15*b*. For example, an insulating material that is the same as the insulating layer 15*i* may be disposed on a coplanar surface defined by the surface 142 of the dielectric layer 14 and the surface 132 of the conductive pad 13.

Figure 3A:
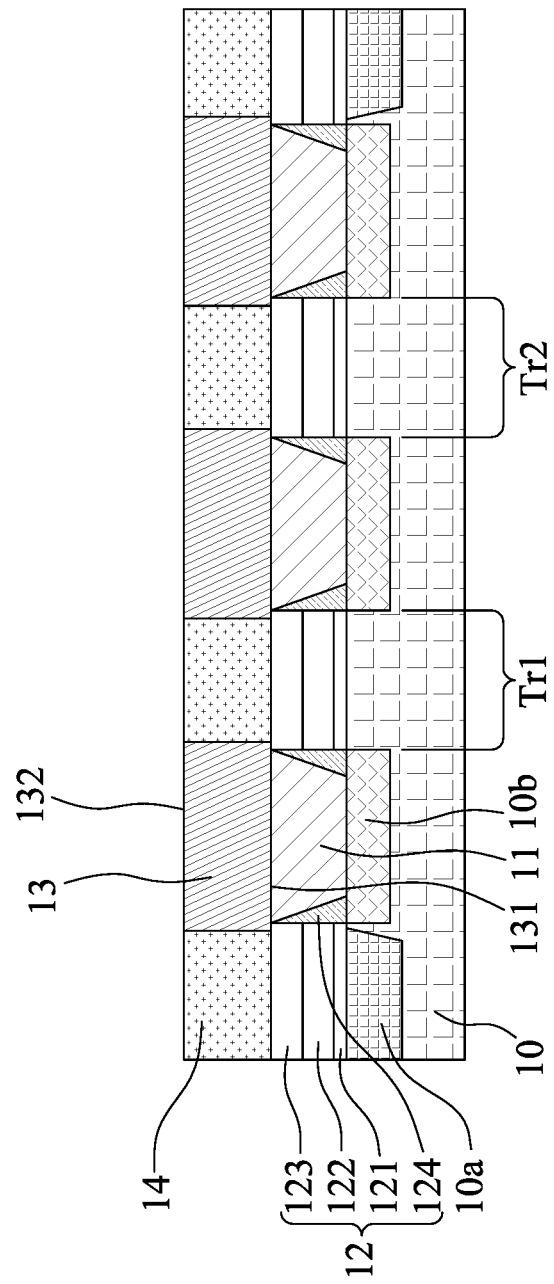
FIG. 3A illustrates one or more stages of a method of manufacturing a semiconductor device in accordance with some embodiments of the present disclosure.
Figure 3B:
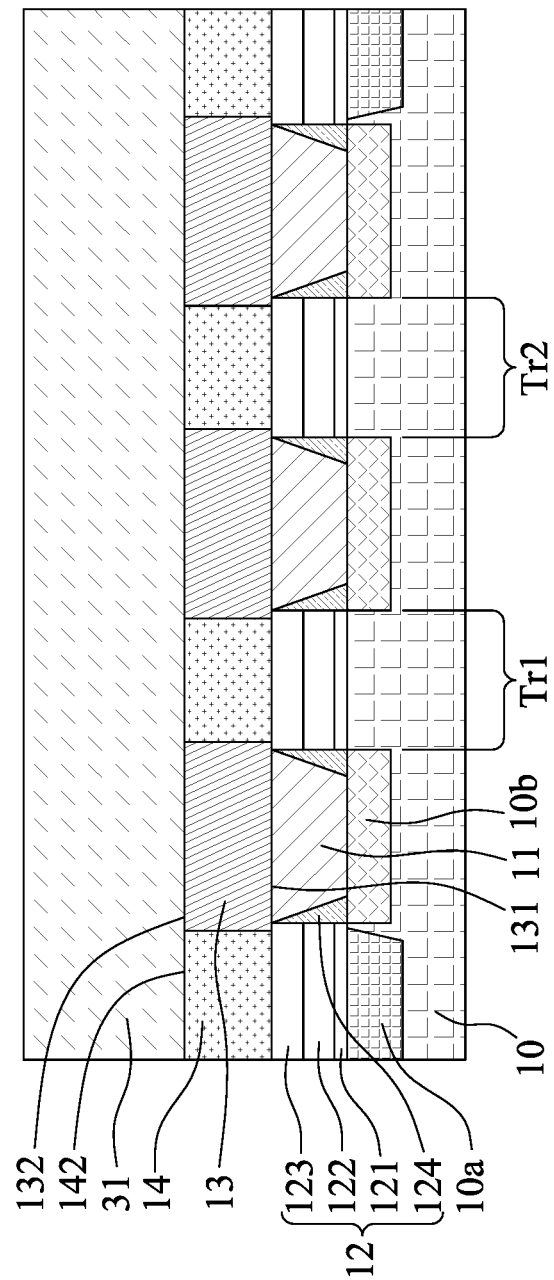
FIG. 3B illustrates one or more stages of a method of manufacturing a semiconductor device in accordance with some embodiments of the present disclosure.
Figure 3C:
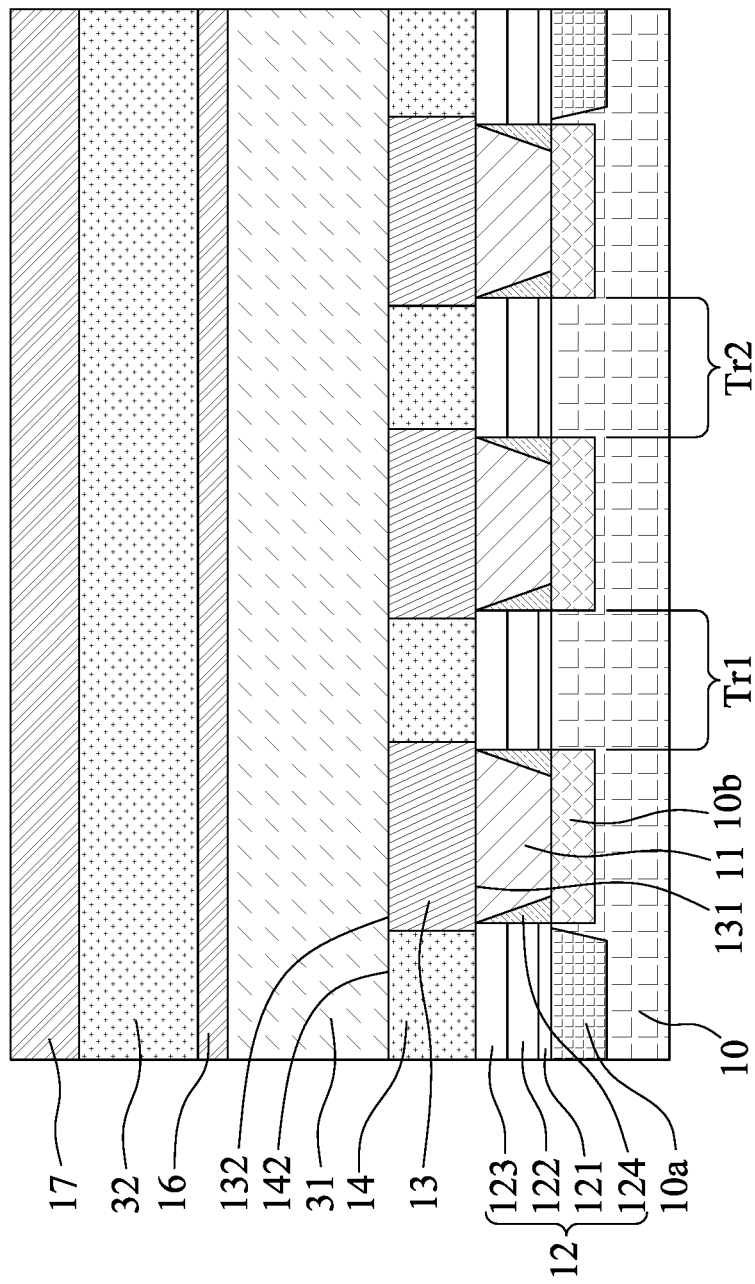
FIG. 3C illustrates one or more stages of a method of manufacturing a semiconductor device in accordance with some embodiments of the present disclosure.
Figure 3D:
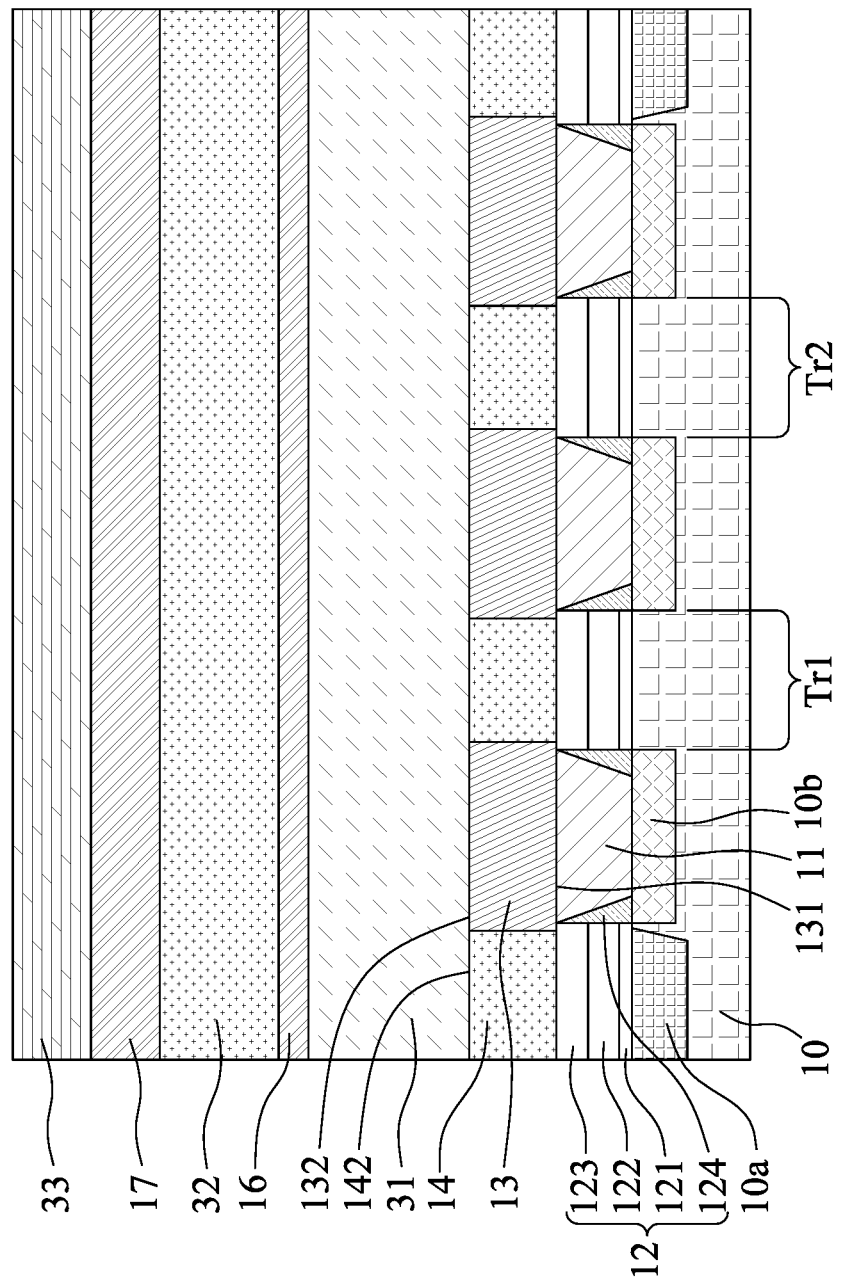
FIG. 3D illustrates one or more stages of a method of manufacturing a semiconductor device in accordance with some embodiments of the present disclosure.
Figure 3E:
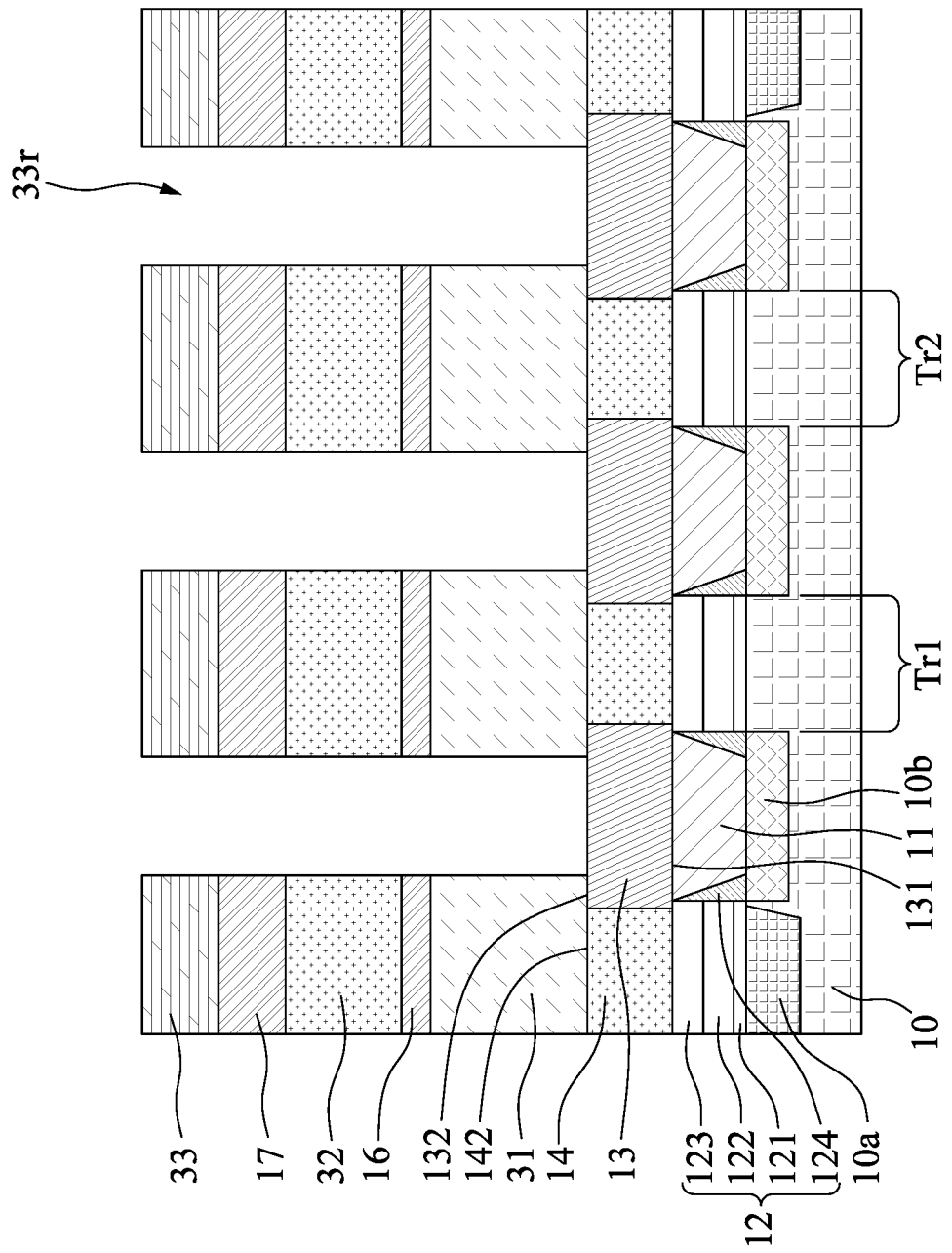
FIG. 3E illustrates one or more stages of a method of manufacturing a semiconductor device in accordance with some embodiments of the present disclosure.
Figure 3F:
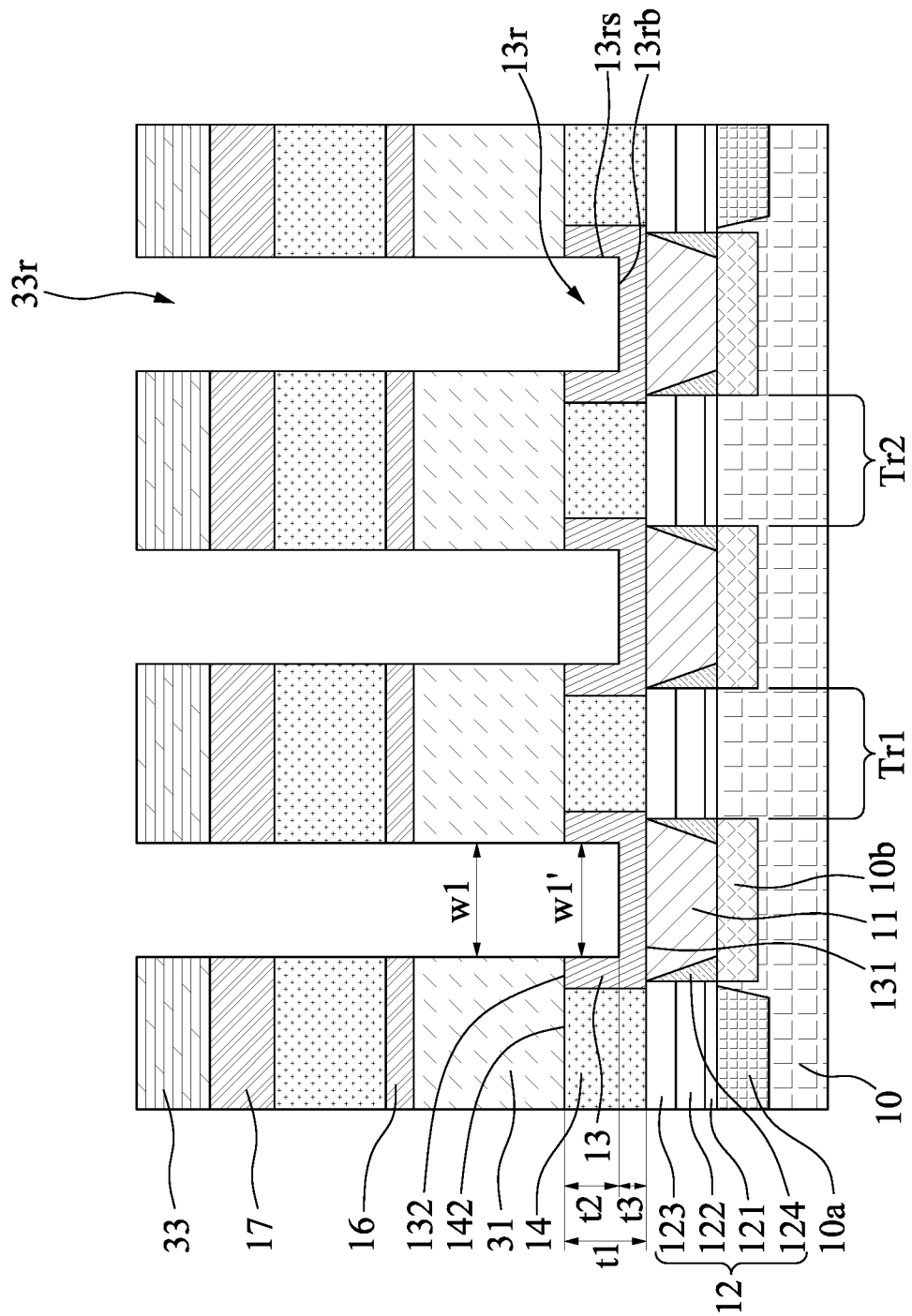
FIG. 3F illustrates one or more stages of a method of manufacturing a semiconductor device in accordance with some embodiments of the present disclosure.
Figure 3G:
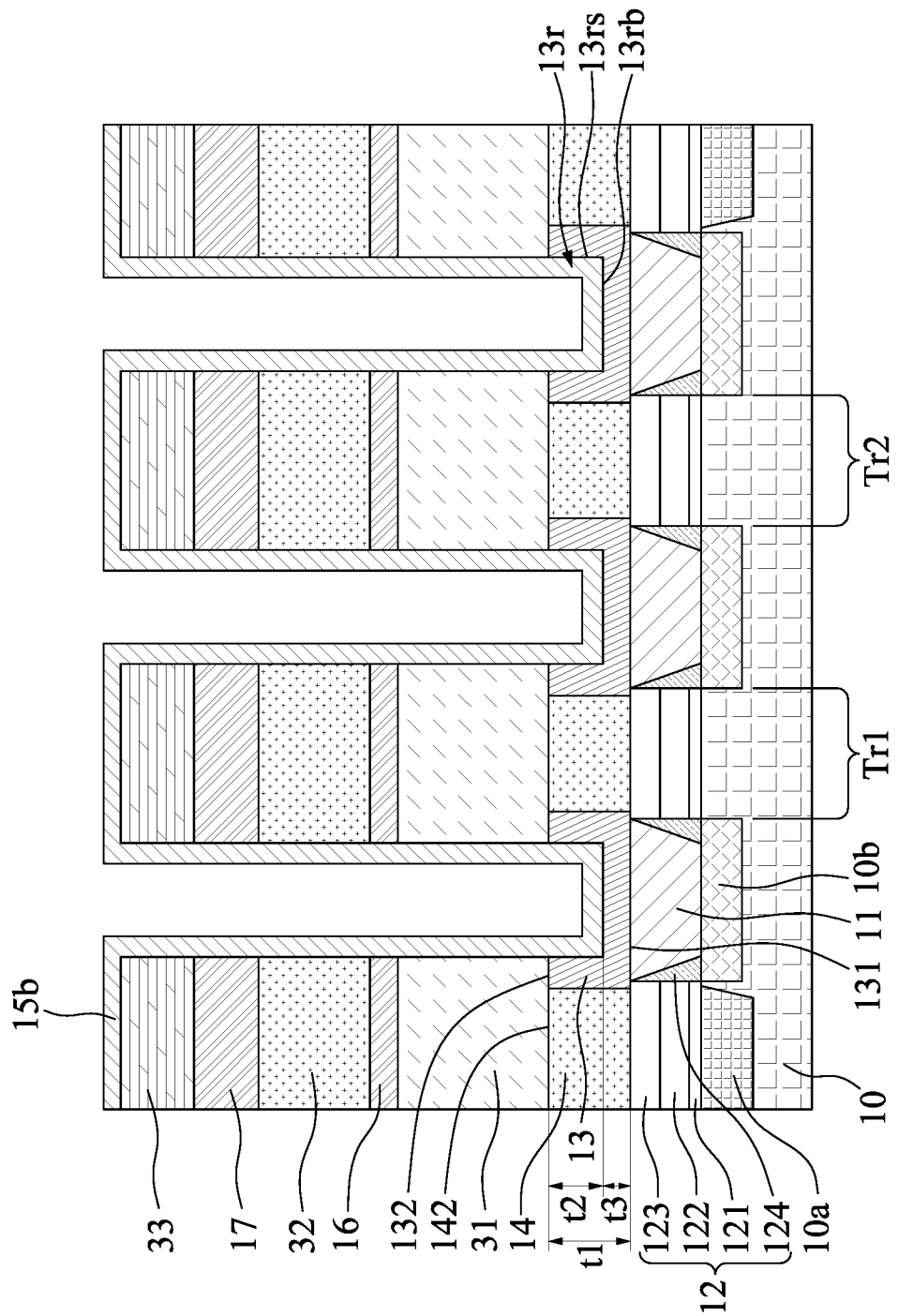
FIG. 3G illustrates one or more stages of a method of manufacturing a semiconductor device in accordance with some embodiments of the present disclosure.
Figure 3H:
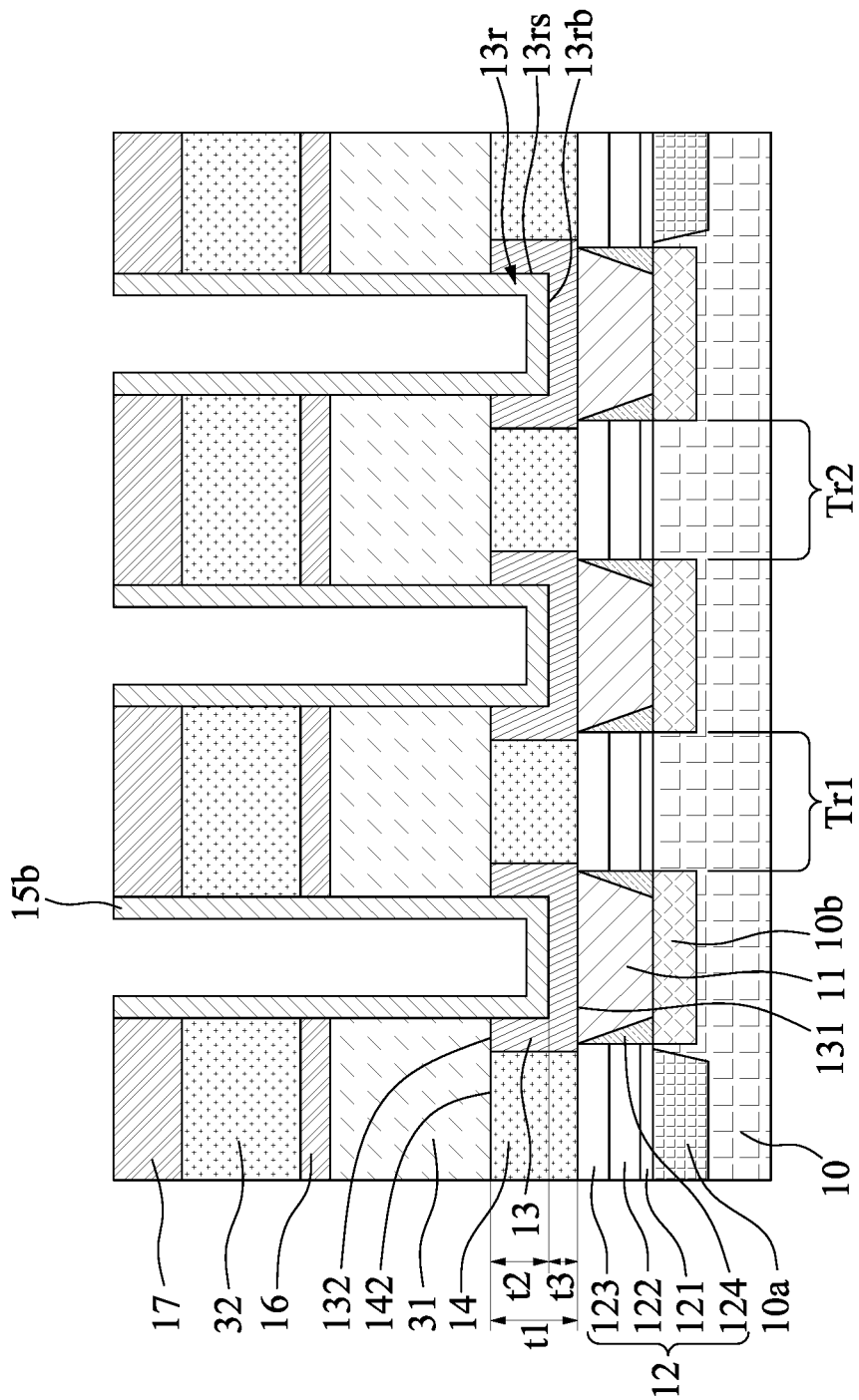
FIG. 3H illustrates one or more stages of a method of manufacturing a semiconductor device in accordance with some embodiments of the present disclosure.
Figure 3I:
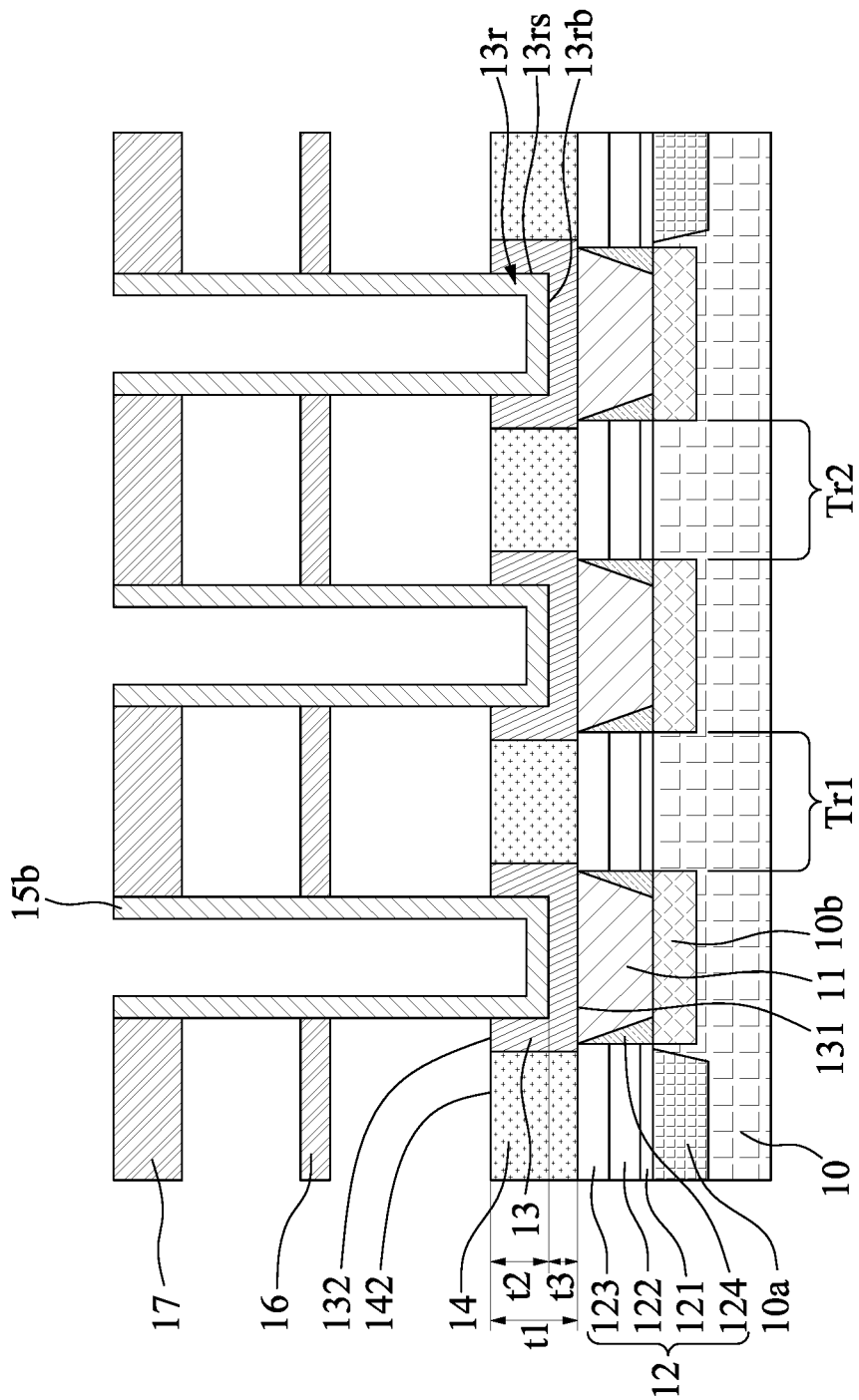
FIG. 3I illustrates one or more stages of a method of manufacturing a semiconductor device in accordance with some embodiments of the present disclosure.

In some embodiments, the surface 142 of the dielectric layer 14 and the surface 132 of the conductive pad 13 may be exposed after a dielectric layer is removed (such as the operation in FIG. 3I). Therefore, in the operation for forming the insulating layers 15*i* and 15*i*' (such as the operation in FIG. 3J), the insulating material of the insulating layers 15*i* and 15*i*' may be disposed on the exposed surfaces of the dielectric layer 14 and the conductive pad 13, forming the insulating layer 15*i*'. In other words, an insulating material that is the same as the insulating layer 15*i* may be disposed on the exposed surfaces of the dielectric layer 14 and the conductive pad 13. The insulating layer 15*i*' may be in contact with the surface 132 of the conductive pad 13. For example, the insulating layer 15*i*' may directly contact the surface 132 of the conductive pad 13.

The top electrode 15*t* may be disposed on the insulating layer 15*i*. For example, the top electrode 15*t* may be disposed on the insulating layer 15*i* within the recessed portion 13*r*. In some embodiments, the top electrode 15*t*' may be disposed on the insulating layer 15*i*' on the coplanar surface defined by the surface 142 of the dielectric layer 14 and the surface 132 of the conductive pad 13. Therefore, a part of the insulating layer 15*i*' (or an insulating material that is the same as the insulating layer 15*i*) may be disposed between the conductive pad 13 and the top electrode 15*t*' (or an electrode material that is the same as the top electrode 15*t*).

In some embodiments, the bottom electrode 15*b* and the top electrode 15*t* may include doped polysilicon (poly-Si) or metal. In some embodiments, the insulating layer 15*i* may include tantalum pentoxide ($Ta_2O_5$), aluminum oxide ($Al_2O_3$), strontium bismuth tantalum oxide ($SrBi_2Ta_2O_9$, SBT), barium strontium titanate oxide ($BaSrTiO_3$, BST), a dielectric material having a dielectric constant that is higher than that of silicon dioxide ($SiO_2$), or a dielectric material having a dielectric constant of about 4.0 or greater. In some embodiments, the insulating layer 15*i* may be formed of a single layer or may be formed of stacked layers.

The supporting structures 16 and 17 may be disposed between two adjacent capacitor structures 15 and 15'. The capacitor structure 15' may be similar to the capacitor structure 15. In some embodiments, the supporting structures 16 and 17 may have a beam-like shape. In some embodiments, adjacent capacitor structures (such as the capacitor structures 15 and 15') may join each other via the supporting structures 16 and 17. In some embodiments, adjacent capacitor structures (such as the capacitor structures 15 and 15') may be connected via the supporting structures 16 and 17.

In some embodiments, the supporting structure 17 may be spaced apart from the supporting structure 16. In some embodiments, a portion of the bottom electrode 15*b* of the capacitor structure 15 between the supporting structures 16 and 17 may be covered by the insulating layer 15*i* or an insulating material that is the same as the insulating layer 15*i*.

In some embodiments, the capacitor structure 15 may be fixed by the supporting structures 16 and 17 and the recessed portion 13*r* defined by the conductive pad 13. For example, the upper portion of the capacitor structure 15 may be fixed by the supporting structure 17, the middle portion of the capacitor structure 15 may be fixed by the supporting structure 16, and the lower portion of the capacitor structure 15 may be fixed by the recessed portion 13*r* defined by the conductive pad 13. In some embodiments, no supporting structure may be needed between the supporting structure 16 and the conductive pad 13. In some embodiments, no supporting structure exists between the supporting structure 16 and the conductive pad 13.

In some embodiments, the capacitor structure 15 may be sequentially in contact with the conductive pad 13, the insulating layer 15*i*' (or an insulating material that is the same as the insulating layer 15*i*), the supporting structure 16, the insulating layer 15*i*' (or an insulating material that is the same as the insulating layer 15*i*), and the supporting structure 17 without being interrupted by other supporting structures. In some embodiments, the capacitor structure 15 may have a surface (or a lateral surface) that has a portion 151 surrounded by the conductive pad 13 and a portion 152 exposed from the conductive pad 13. The portion 151 and the portion 152 may be continuous or connected with each other. The portion 151 and the portion 152 may be coplanar. In some embodiments, the portion 151 may be in contact with the conductive pad 13. In some embodiments, the portion 152 may be surrounded by the insulating layer 15*i*' (or a material that is the same as the insulating layer 15*i*). In some embodiments, the portion 152 may be in contact with the insulating layer 15*i*' (or a material that is the same as the insulating layer 15*i*).

In some embodiments, the supporting structures 16 and 17 may be spaced apart from the conductive pad 13. For example, the supporting structures 16 and 17 may not be in contact with the conductive pad 13. In some embodiments, the conductive pad 13 may not be in contact with other supporting structures.

In some embodiments, the supporting structures 16 and 17 may include, for example, silicon nitride ($Si_3N_4$), tetraethyl orthosilicate (TEOS), tantalum pentoxide ($Ta_2O_5$), aluminum oxide ($Al_2O_3$), strontium bismuth tantalum oxide ($SrBi_2Ta_2O_9$, SBT), barium strontium titanate oxide ($BaSrTiO_3$, BST), $SrTiO_3$(STO), $BaTiO_3$(BTO), $PbZrTiO_3$(PZT) or other suitable materials.

In some embodiments, the insulating layer 18 may cover the exposed surface of the top electrode 15t. In some embodiments, the insulating layer 18 may cover the exposed surface of the semiconductor device 1. In some embodiments, the insulating layers 18 may include, for example, borophosphosilicate glass (BPSG), tetraethyl orthosilicate (TEOS), phosphorus doped tetraethyl orthosilicate (PTEOS), epoxy-based material (e.g., FR4), resin-based material (e.g., Bismaleimide-Triazine (BT)), Polypropylene (PP), molding compound or other suitable materials. In some other embodiments, the top electrode 15t' may be filled in the openings in the insulating layer 15i' (or an insulating material that is the same as the insulating layer 15i). In such embodiments, the insulating layer 18 may not be needed.

In some embodiments, a stacked capacitor having electrodes formed vertically upwards is used in a semiconductor device (such as a DRAM device) for maximizing capacitance and minimizing occupied area. In some embodiments, the capacitance of a capacitor formed with two electrodes may be generally expressed as follows:

$$C = A\varepsilon/d,$$

wherein C is the capacitance of the capacitor, and A is an area of overlap between the two electrodes. In addition, $\varepsilon$ is the dielectric constant of the dielectric between the two electrodes, and d is the thickness of such a dielectric.

For maximizing capacitance of the capacitor structure (such as the capacitor structure 15), the area of overlap between the two electrodes (such as the bottom electrodes 15b and the top electrode 15t) is desired to be maximized. Thus, the height of the bottom electrodes 15b and the top electrode 15t is desired to be maximized. In some embodiments, the supporting structures 16 and 17 may prevent the bottom electrodes 15b from leaning against each other during fabrication. In some embodiments, the supporting structures 16 and 17 may prevent the bottom electrodes 15b from short circuit or wobbling.

However, with ever-increasing height, more supporting structures may be needed to support the bottom electrodes 15b. In addition, because of the high aspect ratio of the opening (such as the opening 33r shown in FIG. 3E) for forming and disposing the electrodes, the supporting structures may be disadvantageously more difficult to be penetrated or punched through, and the bottom electrode 15b subsequently formed within such narrowed openings may have less area of contact with the underlying conductive pad 13. In addition, if the supporting structures are not penetrated or punched through (such as under-etching), the bottom electrode 15b may be disconnected from the conductive pad 13, resulting in malfunction of the semiconductor device 1 and lowering the manufacturing yield.

According to some embodiments of the present disclosure, by providing the recessed portion 13r defined by the conductive pad 13, the capacitor structure 15 may be supported or fixed by the recessed portion 13r. In some embodiments, at least one or more layers of the supporting structures may not be needed. For example, the supporting structure 16, the supporting structure 17, or both may not be needed. In such embodiments, the capacitor structure 15 may be surrounded by the conductive pad 13 and the insulating layer 15i' (or an insulating material that is the same as the insulating layer 15i).

In some embodiments, no supporting structure may be needed between the supporting structure 16 and the conductive pad 13. The under-etching issues may be solved or alleviated. In addition, the contact area between the capacitor structure 15 and the conductive pad 13 may be increased and the electrical stability of the semiconductor device 1 may be enhanced.

Figure 2:
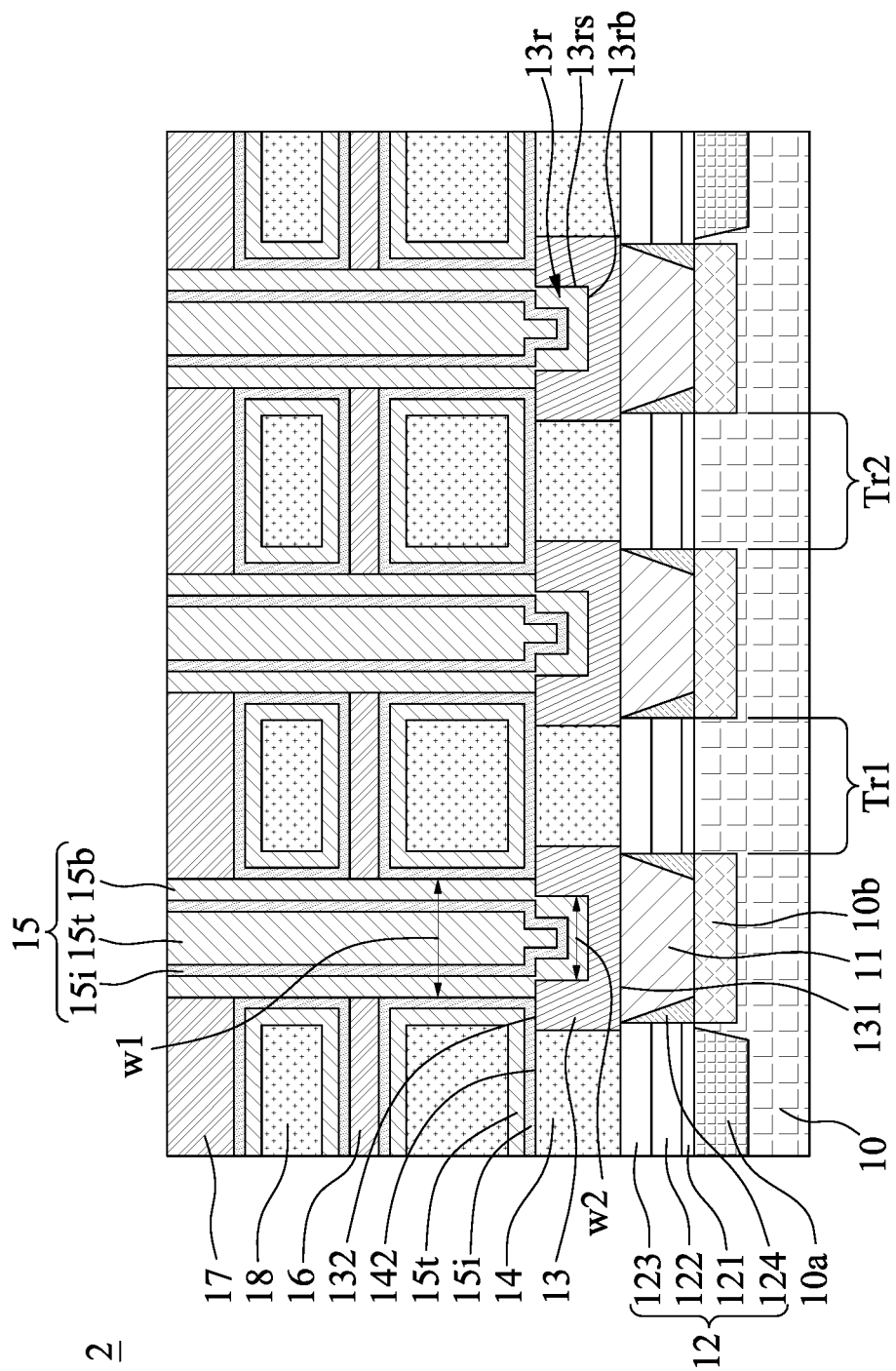
FIG. 2 illustrates a cross-sectional view of a semiconductor device in accordance with some embodiments of the present disclosure.

FIG. 2 illustrates a cross-sectional view of a semiconductor device 2 in accordance with some embodiments of the present disclosure.

The semiconductor device 2 in FIG. 2 is similar to the semiconductor device 1 in FIG. 1 except that the capacitor structure 15 has two different dimensions (such as two different widths or diameters). A part of the capacitor structure 15 that is received or accommodated in the recessed portion 13r defined by the conductive pad 13 has a dimension (or the greatest width or diameter) w2. A part of the capacitor structure 15 that extends from (and is outside of) the recessed portion 13r defined by the conductive pad 13 has a dimension (or the greatest width or diameter) w1. The dimension w1 may be greater than the dimension w2. In some embodiments, the part of the capacitor structure 15 that extends from (and is outside of) the recessed portion 13r defined by the conductive pad 13 may be in contact with the surface 132 of the conductive pad 13. In some embodiments, the bottom electrode 15b may be in contact with the surface 132, the bottom surface 13rb, and the lateral surface 13rs. In some embodiments, the surface 132 may be in contact with both the bottom electrode 15b and the insulating layer 15i' (or an insulating material that is the same as the insulating layer 15i). In some embodiments, the bottom electrode 15b may cover a step structure defined by the surface 132 and the lateral surface 13rs.

FIGS. 3A, 3B, 3C, 3D, 3E, 3F, 3G, 3H, 3I, 3J, 3K, and 3L illustrate stages of a method of manufacturing a semiconductor device in accordance with some embodiments of the present disclosure. At least some of these figures have been simplified for a better understanding of the aspects of the present disclosure. In some embodiments, the semiconductor device 1 in FIG. 1 may be manufactured by the operations described below with respect to FIGS. 3A, 3B, 3C, 3D, 3E, 3F, 3G, 3H, 3I, 3J, 3K, and 3L.

Referring to FIG. 3A, the substrate 10 may be provided. The isolation structures 10a may be formed on the substrate 10, followed by formation of the layers of the gate stack 12. The substrate 1 may then be doped while masked by the gate stack 12, and thus the doped region 10b is formed for transistors Tr1 and Tr2.

In some embodiments, the dielectric layer 14 may be disposed by, for example, atomic layer deposition (ALD), chemical vapor deposition (CVD), physical vapor deposition (PVD), remote plasma CVD (RPCVD), plasma enhanced CVD (PECVD), coating, etc. An opening may be formed in the dielectric layer 14 by lithography and etching techniques. A barrier metal film, for example, a TiN/Ti film may be formed on the inside wall of the opening. A conductive film may be deposited to fill the opening by, for example, CVD, low pressure chemical vapor deposition (LPCVD), having the conductive pad 13. The surface 132 of the conductive pad 13 may be exposed after chemical mechanical polishing (CMP). The surface 132 of the conductive pad 13 may be substantially coplanar with the surface 142 of the dielectric layer 14.

Referring to FIG. 3B, a sacrificial dielectric layer 31 may be disposed on the substrate 10 to cover the surface 132 of the conductive pad 13 and the surface 142 of the dielectric layer 14. In some embodiments, the sacrificial dielectric layer 31 may include a silicon oxide film and may be deposited by, for example, ALD, CVD, PVD, RPCVD, PECVD, LPCVD, coating, etc.

Referring to FIG. 3C, the supporting structure 16, a sacrificial dielectric layer 32, and the supporting structure 17 may be disposed on the sacrificial dielectric layer 31. In some embodiments, the supporting structures 16 and 17 may be made of a material different from the sacrificial dielectric layer 31. For example, the supporting structures 16 and 17 may be made of a material exhibiting an etching property different from the sacrificial dielectric layers 31 and 32. The supporting structures 16 and 17 may be spaced apart from the conductive pad 13 by the sacrificial dielectric layers 31 and 32. In some embodiments, the supporting structures 16 and 17 may be deposited by, for example, ALD, CVD, PVD, RPCVD, PECVD, LPCVD, coating, etc.

Referring to FIG. 3D, a photoresist 33 and a hard mask (not illustrated in the figures) may be provided on the sacrificial dielectric layer 32.

Referring to FIG. 3E, the photoresist 33 may be patterned to define trench patterns to be etched into the supporting structures 16 and 17 and the sacrificial dielectric layers 31 and 32. The supporting structures 16 and 17 and the sacrificial dielectric layers 31 and 32 may be etched by lithography and etching techniques to provide an opening 33r through which the conductive pad 13 is exposed.

Referring to FIG. 3F, the conductive pad 13 may be etched by lithography and etching techniques to form the recessed portion 13r in the conductive pad 13. The bottom surface 13rb of the recessed portion 13r may be exposed to the opening 33r. The lateral surface 13rs of the recessed portion 13r may be substantially coplanar with the lateral surface of the opening 33r. The dimension w1 of the opening 33r may be substantially equal to the dimension w1' of the recessed portion 13r. In some embodiments, the opening 33r and the recessed portion 13r may be formed in different operations. In some embodiments, the opening 33r and the recessed portion 13r may be formed in one operation or the same operation.

Referring to FIG. 3G, the electrode material of the bottom electrode 15b may be disposed on the lateral surface 13rs and the bottom surface 13rb of the recessed portion 13r by, for example, plating, electroless plating, printing, CVD, or other suitable operations. The electrode material of the bottom electrode 15b may also be disposed on the lateral surface of the opening 33r in FIG. 3F and on the photoresist 33.

Referring to FIG. 3H, the photoresist 33 may be removed from the supporting structure 17. In some other embodiments, the photoresist 33 may be removed before disposing the bottom electrode 15b. Therefore, the electrode material of the bottom electrode 15b may also be disposed on the top surface of the supporting structure 17.

Referring to FIG. 3I, the sacrificial dielectric layers 31 and 32 may be removed by, for example, wet etching. For example, the structure obtained from the operation in FIG. 3H may be immersed in a wet chemical bath (such as a hydrofluoric-acid aqueous solution). Alternatively, wet chemicals may be sprayed directly onto the structure obtained from the operation in FIG. 3H. The surface 132 of the conductive pad 13 and the surface 142 of the dielectric layer 14 may be exposed and may define a coplanar surface. The bottom electrode 15b may also be exposed.

Figure 3J:
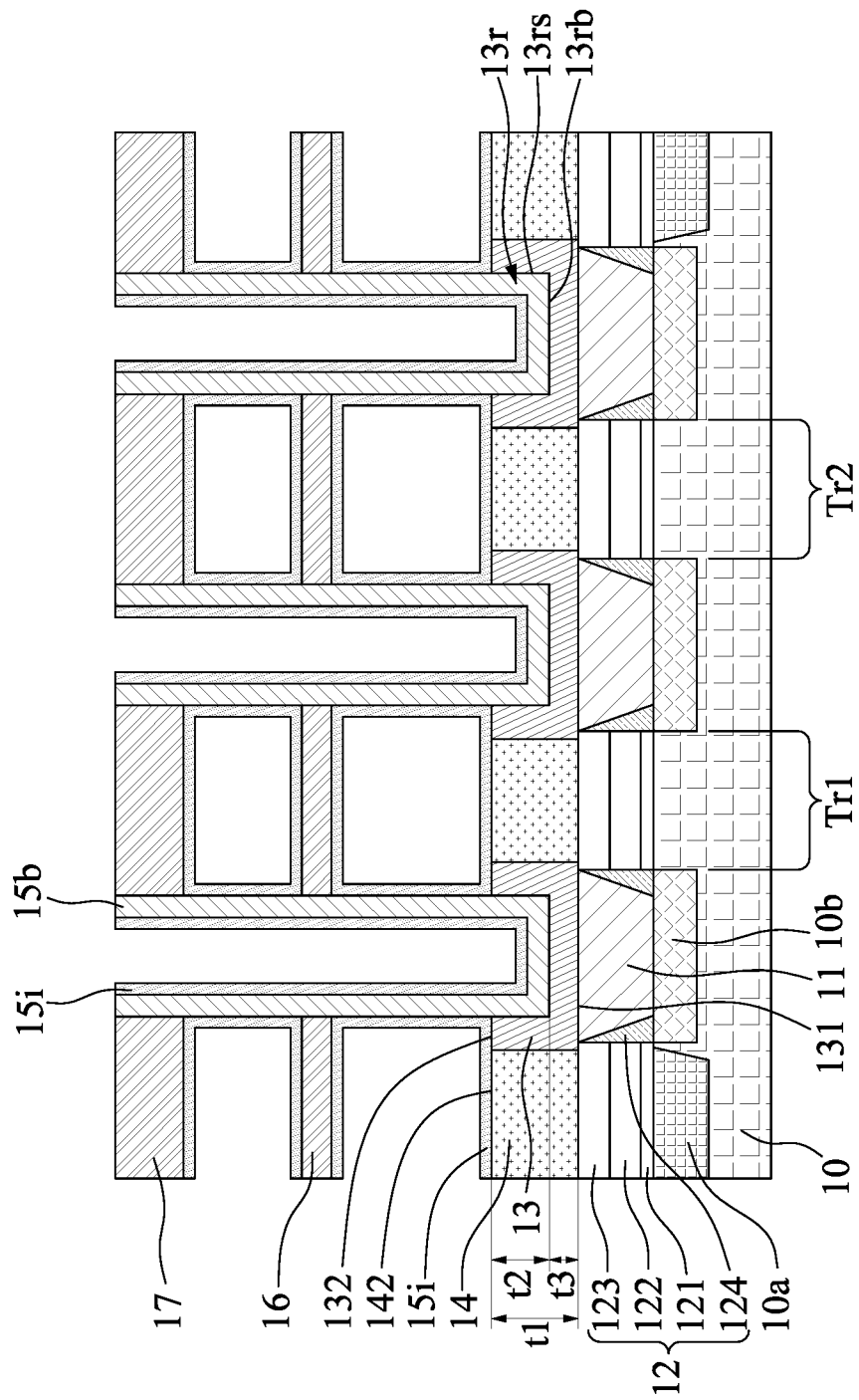
FIG. 3J illustrates one or more stages of a method of manufacturing a semiconductor device in accordance with some embodiments of the present disclosure.

Referring to FIG. 3J, the insulating material of the insulating layer 15i may be disposed on the inside of the bottom electrode 15b by, for example, CVD. The insulating material of the insulating layer 15i' may be disposed on the surface 132 of the conductive pad 13 and the surface 142 of the dielectric layer 14.

Figure 3K:
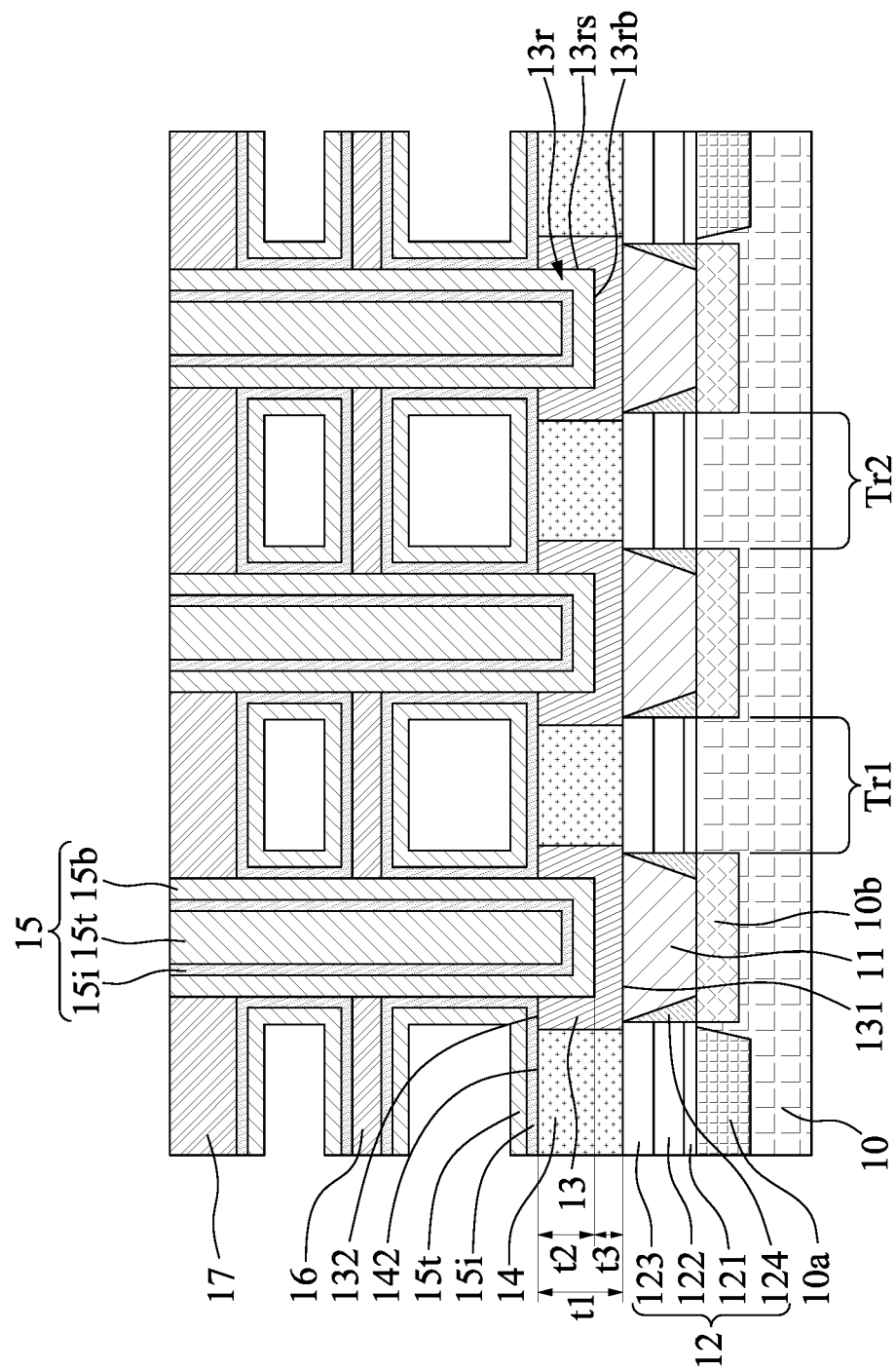
FIG. 3K illustrates one or more stages of a method of manufacturing a semiconductor device in accordance with some embodiments of the present disclosure.

Referring to FIG. 3K, the electrode material of the top electrode 15t may be disposed on the inside of the bottom electrode 15b coated with the insulating layer 15i. The electrode material of the top electrode 15t' may be disposed on the insulating layer 15i'. The top electrode 15t, the bottom electrode 15b, and the insulating layer 15i may constitute the capacitor structure 15. Therefore, the capacitor structure 15 may be at least partially disposed within the recessed portion 13r defined by the conductive pad 13.

Figure 3L:
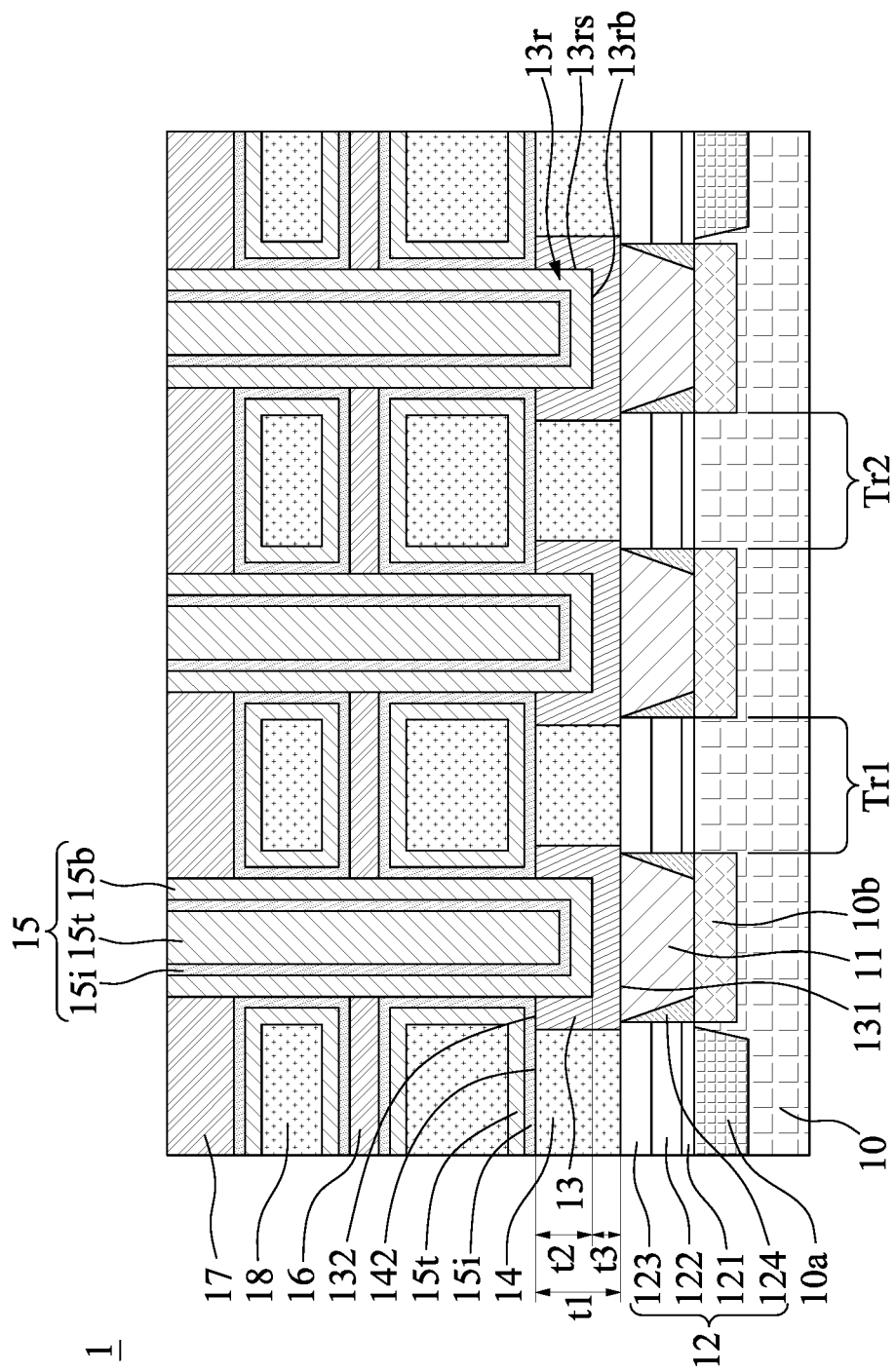
FIG. 3L illustrates one or more stages of a method of manufacturing a semiconductor device in accordance with some embodiments of the present disclosure.

Referring to FIG. 3L, the insulating layer 18 may be deposited inside and outside the capacitor structure 15. In some embodiments, another top electrode and wirings may be provided on each capacitor structure 15 to constitute a memory cell having one transistor and one cylinder-type capacitor.

FIGS. 4A, 4B, 4C, 4D, 4E, 4F, and 4G illustrate stages of a method of manufacturing a semiconductor device in accordance with some embodiments of the present disclosure. At least some of these figures have been simplified for a better understanding of the aspects of the present disclosure. In some embodiments, the semiconductor device 2 in FIG. 2 may be manufactured by the operations described below with respect to FIGS. 4A, 4B, 4C, 4D, 4E, 4F, and 4G.

Figure 4A:
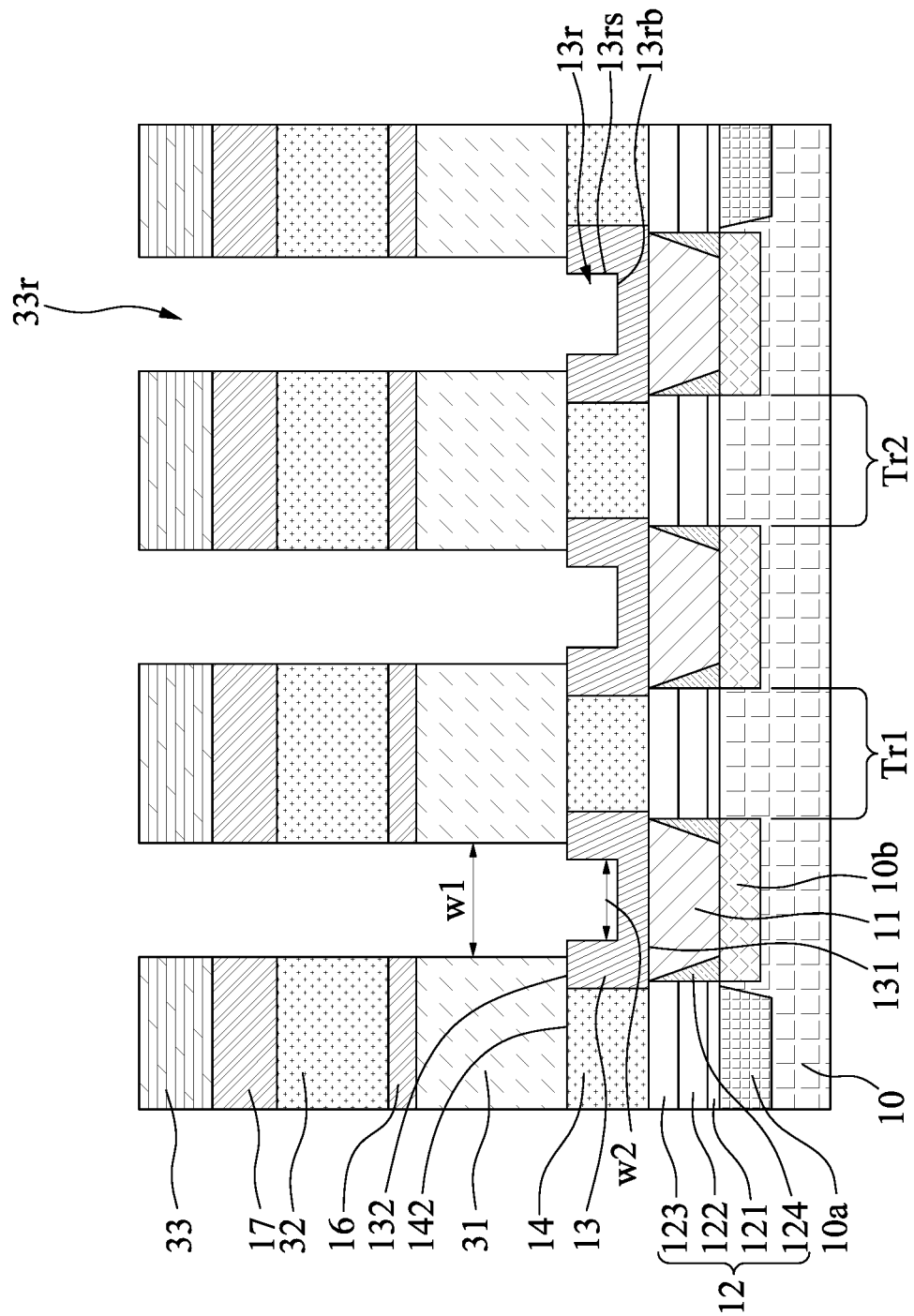
FIG. 4A illustrates one or more stages of a method of manufacturing a semiconductor device in accordance with some embodiments of the present disclosure.

The operation in FIG. 4A may be subsequent to the operation in FIG. 3E. The operation in FIG. 4A is similar to the operations in FIG. 3F except that the lateral surface 13rs of the recessed portion 13r is non-coplanar with the lateral surface of the opening 33r. The dimension w1 of the opening 33r is greater than the width w2 of the recessed portion 13r. The surface 132 of the conductive pad 13 may be partially exposed from the opening 33r.

Figure 4B:
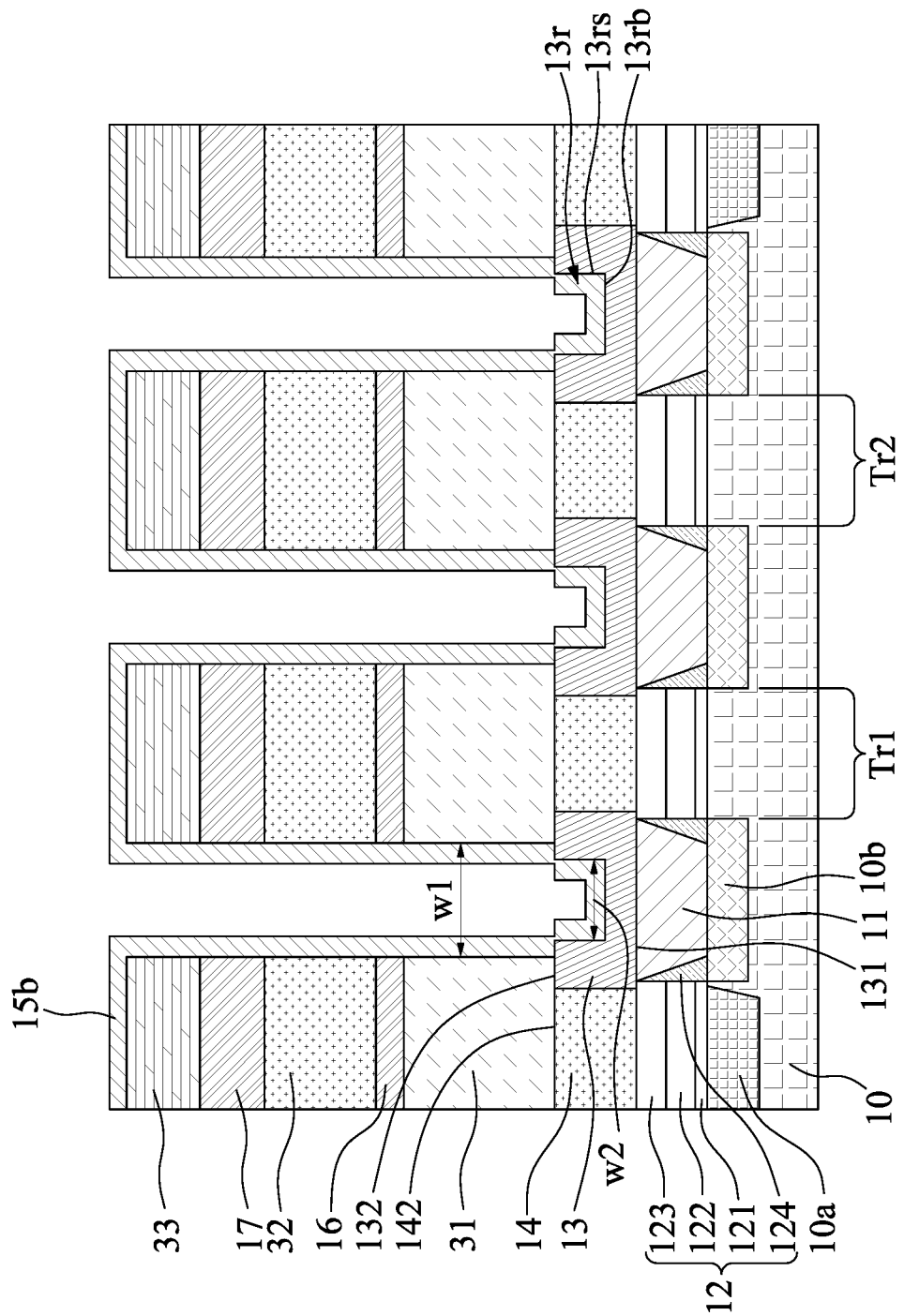
FIG. 4B illustrates one or more stages of a method of manufacturing a semiconductor device in accordance with some embodiments of the present disclosure.

Referring to FIG. 4B, the electrode material of the bottom electrode 15b may be disposed on the lateral surface 13rs and the bottom surface 13rb of the recessed portion 13r. The operation in FIG. 4B is similar to the operations in FIG. 3G except that the electrode material of the bottom electrode 15b is also disposed on a portion of the surface 132 of the conductive pad 13 that is exposed from the opening 33r.

Figure 4C:
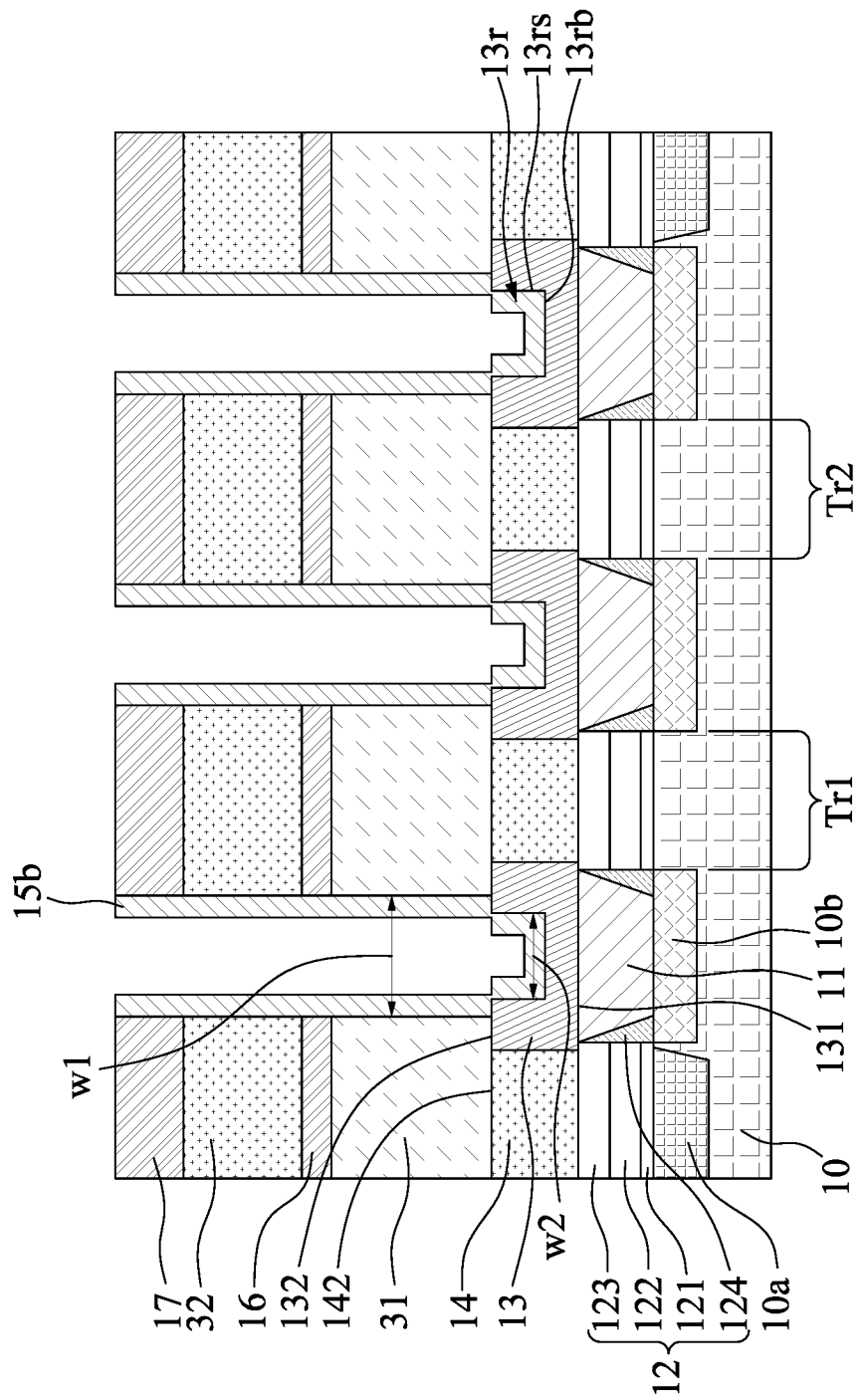
FIG. 4C illustrates one or more stages of a method of manufacturing a semiconductor device in accordance with some embodiments of the present disclosure.

Referring to FIG. 4C, the photoresist 33 may be removed from the supporting structure 17. The operation in FIG. 4C may be similar to the operations in FIG. 3H.

Figure 4D:
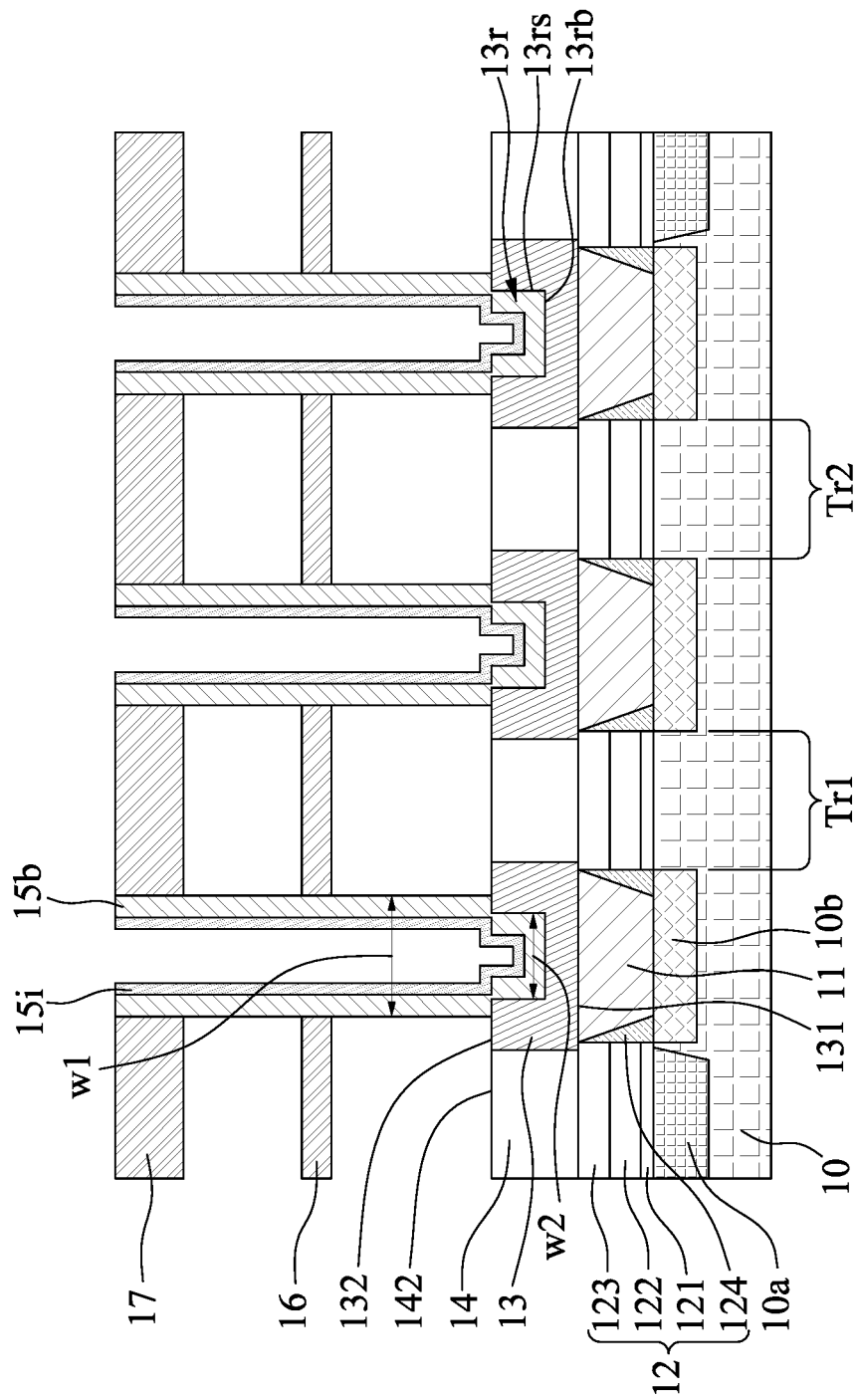
FIG. 4D illustrates one or more stages of a method of manufacturing a semiconductor device in accordance with some embodiments of the present disclosure.

Referring to FIG. 4D, the sacrificial dielectric layers 31 and 32 may be removed by, for example, wet etching. The operation in FIG. 4D may be similar to the operations in FIG. 3I.

Figure 4E:
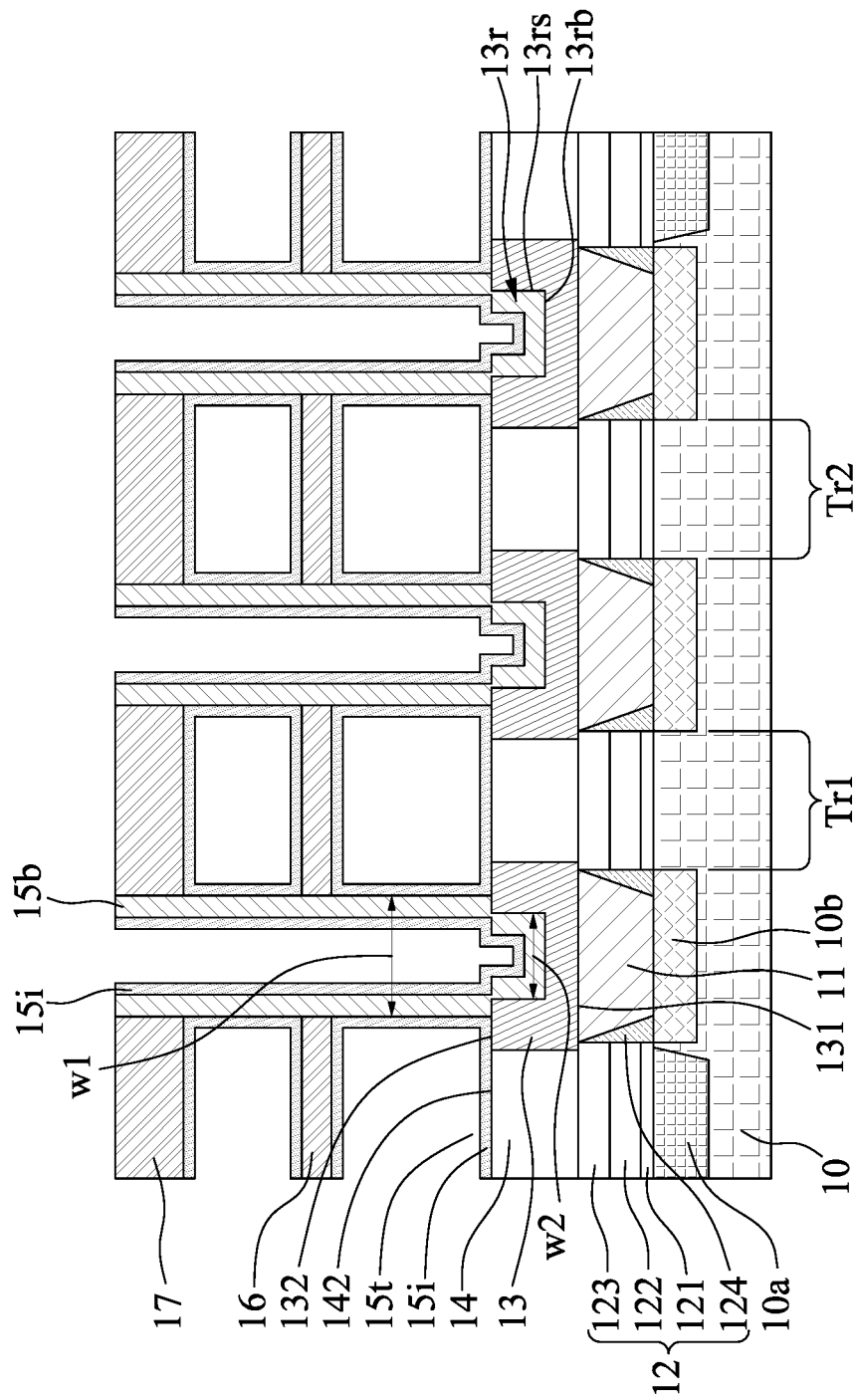
FIG. 4E illustrates one or more stages of a method of manufacturing a semiconductor device in accordance with some embodiments of the present disclosure.

Referring to FIG. 4E, the insulating layer 15i may be disposed on the inside of the bottom electrode 15b by, for example, CVD. The insulating material of the insulating layer 15i' may be disposed on the surface 132 of the conductive pad 13 and the surface 142 of the dielectric layer 14. The operation in FIG. 4E may be similar to the operations in FIG. 3J.

Figure 4F:
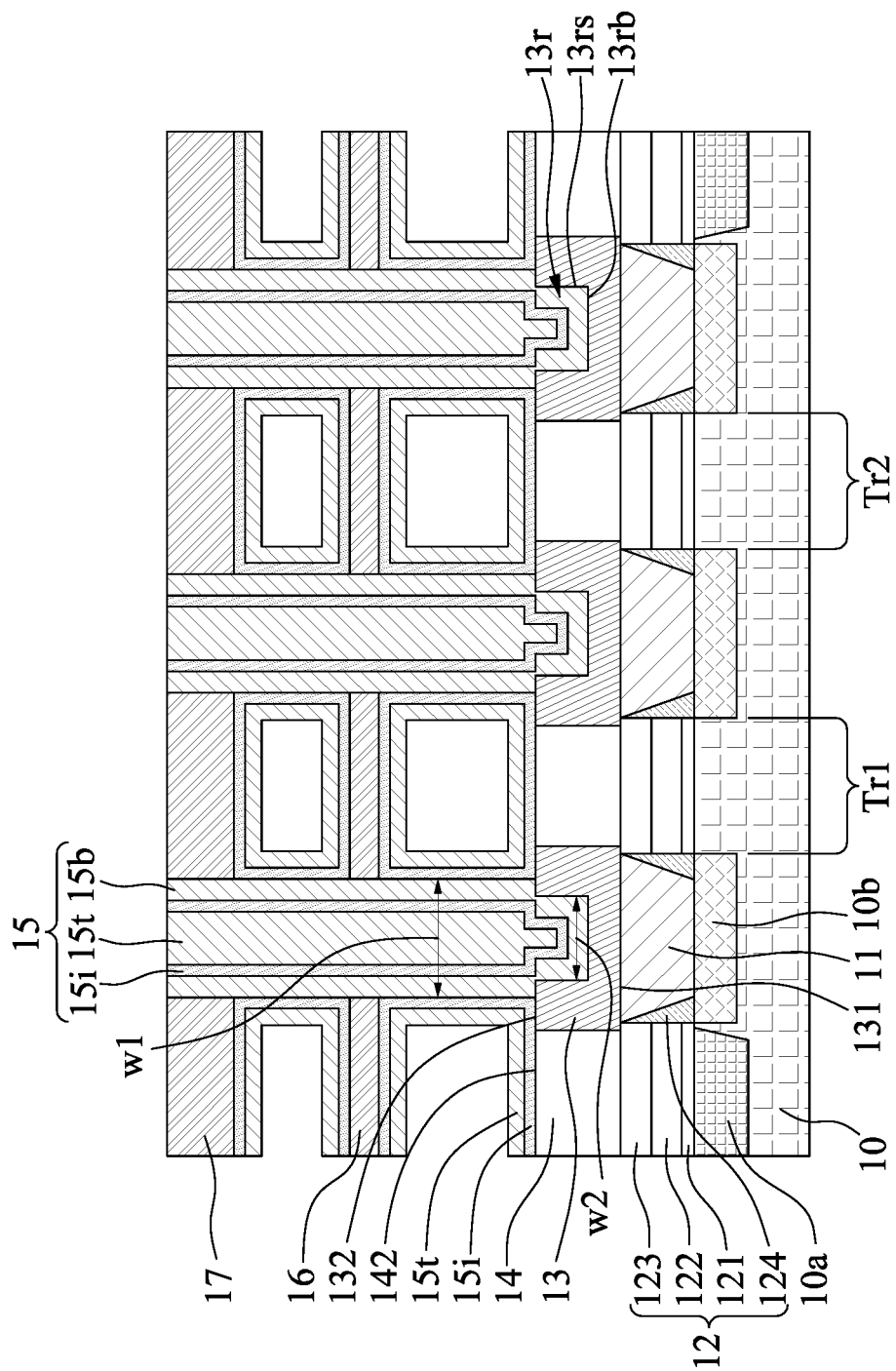
FIG. 4F illustrates one or more stages of a method of manufacturing a semiconductor device in accordance with some embodiments of the present disclosure.

Referring to FIG. 4F, the electrode material of the top electrode 15t may be disposed on the inside of the bottom electrode 15b coated with the insulating layer 15i. The electrode material of the top electrode 15t' may be disposed on the insulating layer 15i'. The top electrode 15t, the bottom electrode 15b, and the insulating layer 15i may constitute the capacitor structure 15. Therefore, the capacitor structure 15 may be at least partially disposed within the recessed portion 13r defined by the conductive pad 13. The operation in FIG. 4F may be similar to the operations in FIG. 3K.

Figure 4G:
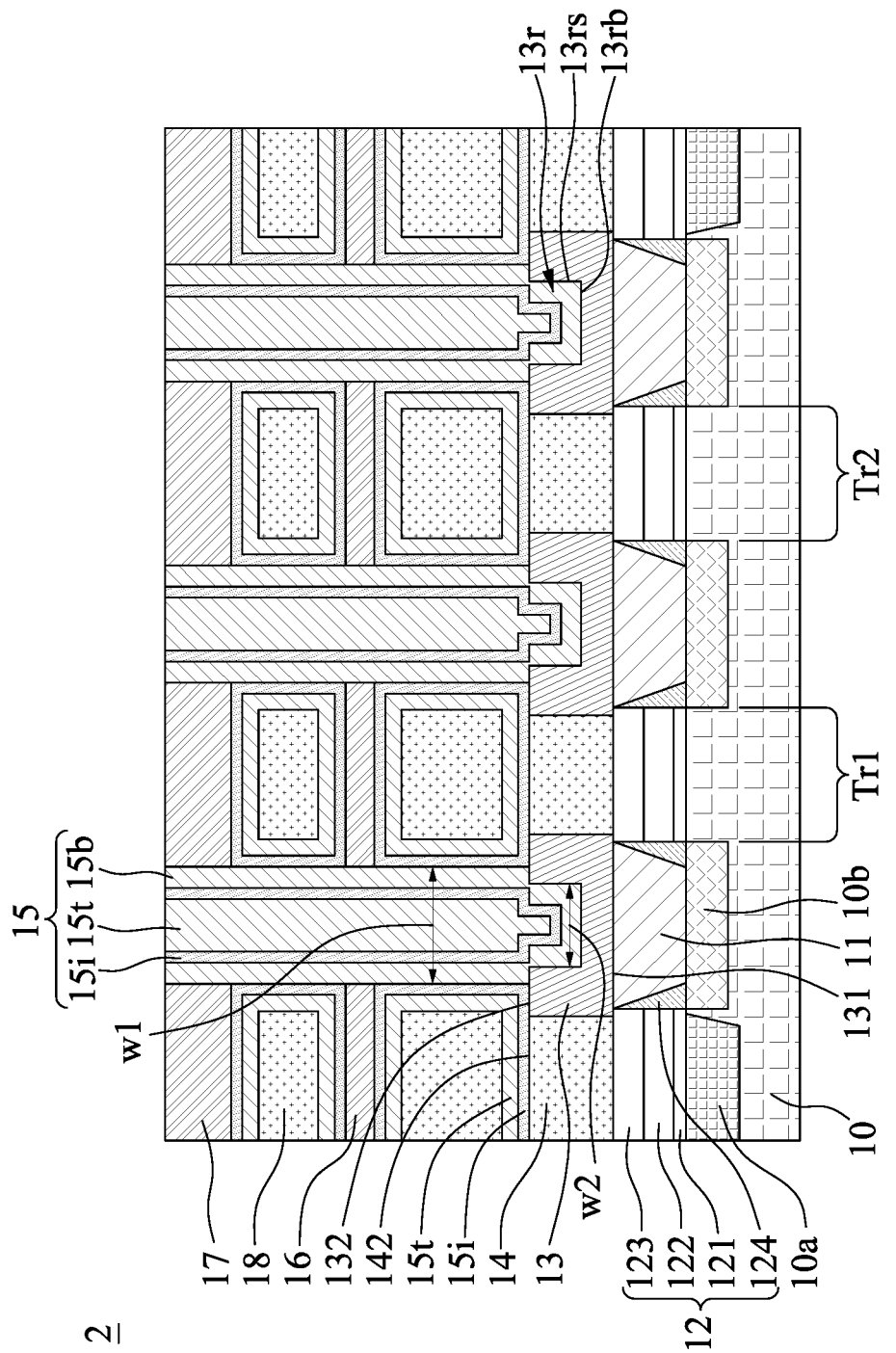
FIG. 4G illustrates one or more stages of a method of manufacturing a semiconductor device in accordance with some embodiments of the present disclosure.

Referring to FIG. 4G, the insulating layer 18 may be deposited inside and outside the capacitor structure 15. In some embodiments, another top electrode and wirings may be provided by known techniques on each capacitor structure 15 to constitute a memory cell having one transistor and one cylinder-type capacitor. The operation in FIG. 4G may be similar to the operations in FIG. 3L.

Figure 5:
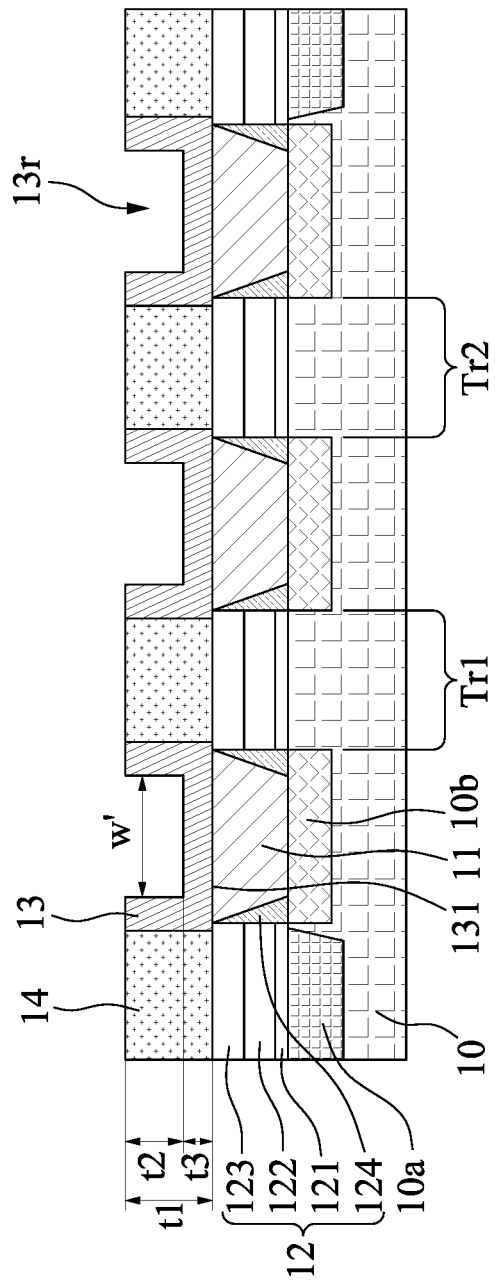
FIG. 5 illustrates one or more stages of a method of manufacturing a semiconductor device in accordance with some embodiments of the present disclosure.

FIG. 5 illustrates stages of a method of manufacturing a semiconductor device in accordance with some embodiments of the present disclosure. At least some of these figures have been simplified for a better understanding of the aspects of the present disclosure. In some embodiments, the semiconductor device 1 in FIG. 1 or the semiconductor device 2 in FIG. 2 may be manufactured by the operations described below with respect to the FIG. 5.

The operation in FIG. 5 may be subsequent to the operation in FIG. 3A and before the operation in FIG. 3B. The recessed portion 13r is formed before the sacrificial dielectric layer 31 is disposed on the substrate 10. The sacrificial dielectric layer 31 may then be disposed on the bottom surface 13rb and the lateral surface 13rs of the recessed portion 13r.

After disposing the sacrificial dielectric layer 31, other operations similar to the operations in FIGS. 3C, 3D, 3E, 3F, 3G, 3H, 3I, 3J, 3K, and 3L may be performed to manufacture the semiconductor device 1 in FIG. 1 or the semiconductor device 2 in FIG. 2, depending on whether the dimension w' of the recessed portion 13r is substantially equal to or smaller than the opening in the sacrificial dielectric layer 31.

One aspect of the present disclosure provides a semiconductor device. The semiconductor device includes a substrate and a conductive pad disposed on the substrate and having a first surface facing away from the substrate. The first surface of the conductive pad is recessed toward the substrate and defines a recessed portion. The semiconductor device also includes a capacitor structure at least partially disposed within the recessed portion of the conductive pad and electrically connected with the substrate through the conductive pad.

Another aspect of the present disclosure provides a semiconductor device. The semiconductor device includes a substrate and a conductive pad disposed on the substrate. The semiconductor device also includes a capacitor structure disposed on the conductive pad and electrically connected with the substrate through the conductive pad. The capacitor structure at least partially extends into the conductive pad.

Another aspect of the present disclosure provides a method of manufacturing a semiconductor device. The method includes disposing a dielectric layer on a conductive pad and forming an opening through the dielectric layer. A lateral surface and a bottom surface of a recessed portion of the conductive pad are exposed through the opening of the dielectric layer. The method also includes disposing an electrode material on the lateral surface and the bottom surface of the recessed portion of the conductive pad.

The recessed portion defined by the conductive pad may support or fix the capacitor structure. Therefore, no (or less) supporting structure is needed. The under-etching issues may be solved or alleviated. In addition, the contact area between the capacitor structure and the conductive pad may be increased and the electrical stability of the semiconductor device may be enhanced.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of manufacturing a semiconductor device, comprising: disposing a dielectric layer on a conductive pad to cover a top surface of the conductive pad, wherein the dielectric layer is in contact with the top surface of the conductive pad; forming an opening through the dielectric layer to expose a portion of the top surface of the conductive pad; etching the conductive pad to form a recessed portion from the top surface thereof, wherein a lateral surface and a bottom surface of the recessed portion of the conductive pad are exposed to the opening of the dielectric layer, wherein the opening has a uniform width through the dielectric layer; and disposing an electrode material on the lateral surface and the bottom surface of the recessed portion of the conductive pad, wherein a width of the recessed portion of the conductive pad is less than a width of the opening of the dielectric layer, such that the portion of the top surface of the conductive pad is partially exposed through the opening.

2. The method of claim 1, wherein the recessed portion of the conductive pad is formed after disposing the dielectric layer on the conductive pad and after forming the opening through the dielectric layer.

3. The method of claim 1, further comprising:
after the recessed portion is formed and the electrode material is disposed on the lateral surface and the bottom surface of the recessed portion of the conductive pad, removing the dielectric layer from the conductive pad to expose the top surface of the conductive pad which is covered by the dielectric layer; and
disposing an insulating layer on the top surface of the conductive pad, wherein the insulating layer is in contact with the top surface of the conductive pad.

4. The method of claim 1, further comprising:
disposing an insulating material on the electrode material, such that the insulating material is surrounded by the electrode material; and
disposing a second electrode material on the insulating layer, such that the second electrode material is surrounded by the insulating layer, wherein a top surface of the electrode material, a top surface of the insulating material, and a top surface of the second electrode material are coplanar with each other.

* * * * *